(12) United States Patent
Choi et al.

(10) Patent No.: US 12,414,440 B2
(45) Date of Patent: Sep. 9, 2025

(54) DISPLAY DEVICE

(71) Applicant: Samsung Display Co., LTD., Yongin-si (KR)

(72) Inventors: Jong Hyun Choi, Seoul (KR); Dae Suk Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 835 days.

(21) Appl. No.: 17/471,366

(22) Filed: Sep. 10, 2021

(65) Prior Publication Data

US 2022/0246706 A1 Aug. 4, 2022

(30) Foreign Application Priority Data

Feb. 4, 2021 (KR) ........................ 10-2021-0016201

(51) Int. Cl.
*H10K 59/121* (2023.01)
*H10K 59/126* (2023.01)
*H10K 59/131* (2023.01)

(52) U.S. Cl.
CPC ....... *H10K 59/1213* (2023.02); *H10K 59/126* (2023.02); *H10K 59/131* (2023.02)

(58) Field of Classification Search
CPC ............. H10K 59/1213; H10K 59/126; H10K 59/131; H10K 59/124
See application file for complete search history.

(56) References Cited

U.S. PATENT DOCUMENTS

| 10,062,743 | B2 | 8/2018 | Lee et al. |
| 10,573,703 | B2 | 2/2020 | Lee et al. |
| 10,903,298 | B2 | 1/2021 | Lee et al. |
| 10,943,965 | B2 | 3/2021 | Cho et al. |
| 11,063,068 | B2 * | 7/2021 | Jeon ..................... H10D 86/481 |
| 11,711,951 | B2 | 7/2023 | Lee et al. |
| 12,052,888 | B2 | 7/2024 | Cho et al. |
| 12,120,930 | B2 | 10/2024 | Lee et al. |
| 2022/0123093 | A1 | 4/2022 | Kim et al. |
| 2024/0389391 | A1 | 11/2024 | Cho et al. |
| 2025/0040365 | A1 | 1/2025 | Lee et al. |

FOREIGN PATENT DOCUMENTS

| KR | 10-1640192 B1 | 7/2016 |
| KR | 1020170115150 A | 10/2017 |
| KR | 20170127602 A | 11/2017 |
| KR | 1020190135585 A | 12/2019 |
| KR | 20200009171 A | 1/2020 |
| KR | 20200088953 A | 7/2020 |

\* cited by examiner

*Primary Examiner* — David Vu

(74) *Attorney, Agent, or Firm* — CANTOR COLBURN LLP

(57) ABSTRACT

A display device includes a substrate, a semiconductor layer on the substrate and including a channel area of a first transistor, a first insulating layer on the semiconductor layer, a first conductive layer on the first insulating layer and including a plurality of split patterns which overlap with the channel area of the first transistor, a second insulating layer on the first conductive layer, a shield pattern on the second insulating layer and having a constant voltage applied thereto, a third insulating layer on the second conductive layer, and a third conductive layer on the third insulating layer and including a scan connecting pattern which electrically connects the split patterns to each other and overlaps with the semiconductor layer in an overlapping area different from the channel area.

19 Claims, 12 Drawing Sheets

DISPLAY DEVICE

This application claims priority to Korean Patent Application No. 10-2021-0016201 filed on Feb. 4, 2021, and all the benefits accruing therefrom under 35 U.S.C. 119, the contents of which in its entirety are herein incorporated by reference.

BACKGROUND

1. Field

The disclosure relates to a display device.

2. Description of the Related Art

As the information society has developed, the demand for display devices for displaying images has diversified. For example, display devices have been applied to various electronic devices such as smart phones, digital cameras, notebook computers, navigation systems, and smart televisions ("TVs").

Examples of a display device include a light-receiving display device such as a liquid crystal display ("LCD") device or a field emission display ("FED") device, or a light-emitting display device such as an organic light-emitting display device including organic light-emitting elements, an inorganic light-emitting display device including inorganic light-emitting elements, or a micro-light-emitting display device including micro-light-emitting elements.

As the organic light-emitting display device includes light-emitting elements that allow pixels of a display panel to emit light, the organic light-emitting display device can display an image without including a backlight unit that provides light to the display panel.

SUMMARY

Embodiments provide a display device capable of preventing or suppressing defects such as smudges by reducing the coupling and the parasitic capacitance between conductive lines and a semiconductor layer which is adjacent to the conductive lines.

However, embodiments are not restricted to those set forth herein. The above and other embodiments will become more apparent to one of ordinary skill in the art to which the invention pertains by referencing the detailed description given below.

An embodiment of a display device includes a substrate, a semiconductor layer on the substrate, the semiconductor layer including a channel area of a first transistor, a first insulating layer on the semiconductor layer, a first conductive layer on the first insulating layer, the first conductive layer including a plurality of split patterns, which overlap with the channel area of the first transistor, a second insulating layer on the first conductive layer, a shield pattern on the second insulating layer, the shield pattern having a constant voltage applied thereto, a third insulating layer on the second conductive layer, and a third conductive layer on the third insulating layer, the third conductive layer including a scan connecting pattern, which electrically connects split patterns that are adjacent to each other and overlaps with the semiconductor layer in an overlapping area different from the channel area.

An embodiment of a display device includes a first power supply voltage line, a light-emitting element, a first transistor between the first power supply voltage line and the light-emitting element, a second transistor between a gate electrode and a first electrode of the first transistor, a first scan line including a plurality of split patterns, which include a gate electrode of the second transistor, and a scan connecting pattern, which electrically connects split patterns that are adjacent to each other, and a shield pattern electrically connected to the first power supply voltage line, the shield pattern overlapping with the scan connecting pattern, where the plurality of split patterns are portions of a first conductive layer, and the scan connecting pattern is a portion of a second conductive layer which is different from the first conductive layer.

An embodiment of a display device includes a light-emitting element, a first transistor controlling a driving current that flows into the light-emitting element, in accordance with a voltage applied to a gate electrode of the first transistor, an initialization voltage line initializing the gate electrode of the first transistor, a second transistor between a first electrode and the gate electrode of the first transistor, a third transistor between the second transistor and the initialization voltage line, a fourth transistor between the third transistor and the light-emitting element, and a scan line including gate electrodes of the third and fourth transistors, where the scan line includes a base part, which includes the gate electrode of the third transistor and extends in a first direction, and a protruding part, which protrudes, in a second direction intersecting the first direction, from the base part toward the initialization voltage line and includes the gate electrode of the fourth transistor, and the fourth transistor is electrically connected to the initialization voltage line through a data pattern not overlapping with the scan line.

According to the aforementioned and other embodiments, defects such as smudges can be prevented or suppressed by reducing the coupling and the parasitic capacitance between conductive lines and a semiconductor layer adjacent to the conductive lines.

Other features and embodiments may be apparent from the following detailed description, the drawings, and the claims.

BRIEF DESCRIPTION OF THE DRAWINGS

The above and other embodiments and features of the invention will become more apparent by describing in detail embodiments thereof with reference to the attached drawings, in which.

DETAILED DESCRIPTION

Figure 1:
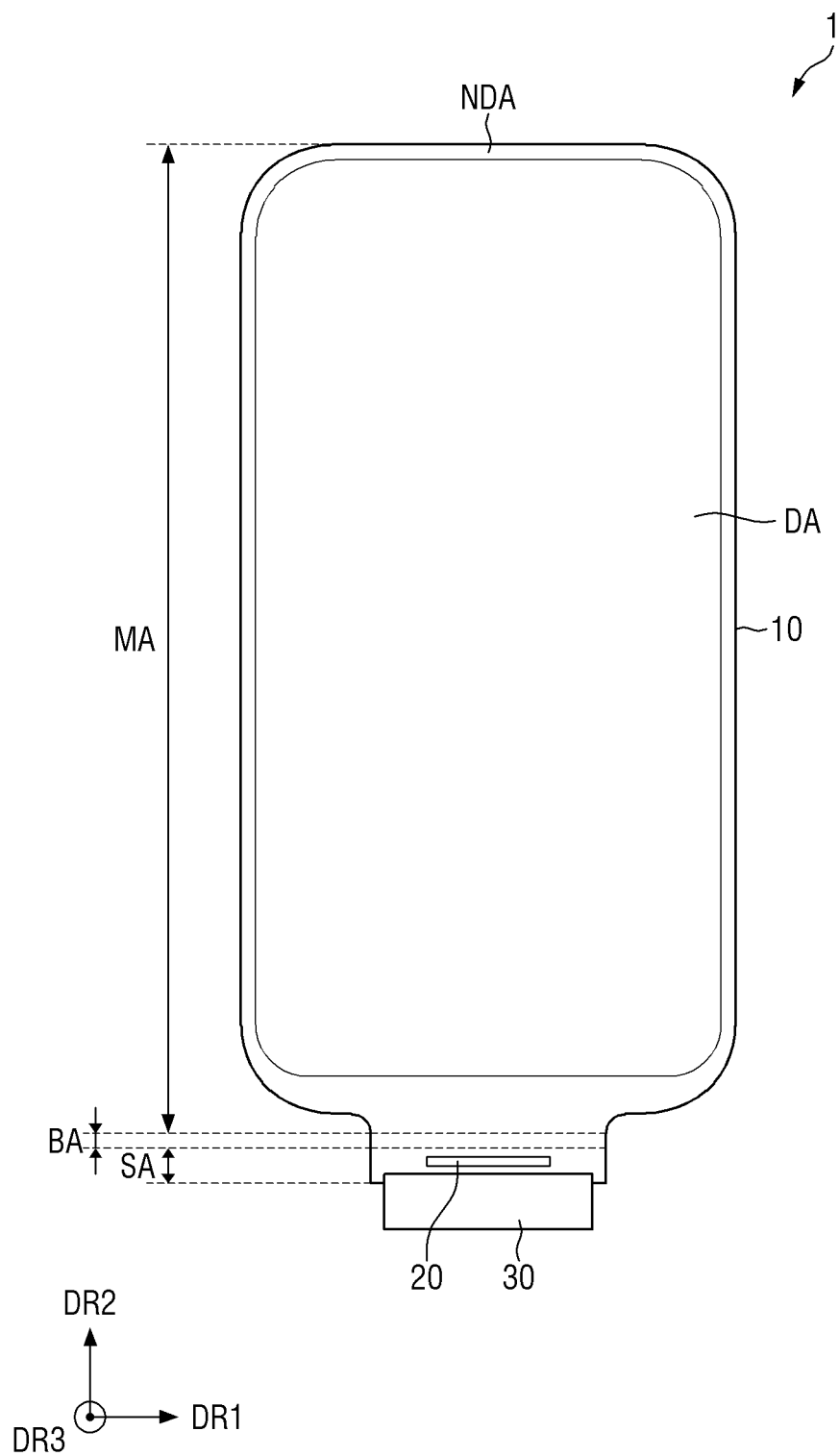
FIG. 1 is a plan view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no other layer or substrate, or intervening layers is present.

The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings.

Figure 2:
FIG. 2 is a cross-sectional side view illustrating the display device of FIG. 1 which is bent.
Figure 2:
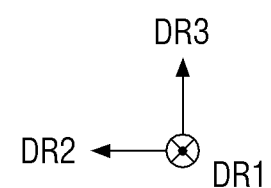

FIG. 1 is a plan view of an embodiment of a display device 1 which is flat. FIG. 2 is a cross-sectional side view illustrating the display device 1 of FIG. 1 which is bent.

A first direction DR1 and a second direction DR2 are different directions and intersect each other. For convenience, the first and second directions DR1 and DR2 are defined as horizontal and vertical directions, respectively. In a plan view, a direction in the first direction DR1 may refer to a rightward direction, a direction opposite to the first direction DR1 may refer to a leftward direction, a direction in the second direction DR2 may refer to an upward direction, and a direction opposite to the second direction DR2 may refer to a downward direction.

A third direction DR3 may be a direction intersecting both of the first and second directions DR1 and DR2 which define a plane. The third direction DR3 may perpendicularly intersect the plane defined by the first and second directions DR1 and DR2 crossing each other. The third direction DR3 may otherwise define a thickness direction of the display device 1 and various elements or layers thereof. However, the first, second, and third directions DR1, DR2, and DR3 are not particularly limited, but should be understood as being directions relative to one another.

Unless specified otherwise, the terms "above", "top surface", and "upper", as used herein, refer to the side of the display surface of a display panel 10, and the terms "below", "bottom surface", and "lower", as used herein, refer to the opposite side to the display surface of the display panel 10. The sides described above may be positioned along the third direction DR3.

Referring to FIGS. 1 and 2, a display device 1 may be used as or define not only as the display screen of a mobile electronic device such as a mobile phone, a smartphone, a tablet personal computer ("PC"), a mobile communication terminal, an electronic notepad, an electronic book ("e-book"), a portable multimedia player ("PMP"), a navigation device, or an ultramobile PC ("UMPC"), but also as the display screen of various other products such as a television ("TV"), a notebook computer, a monitor, an electronic billboard, or an Internet-of-Things ("IoT") device.

The display device 1 may have a substantially rectangular shape in a plan view. The display device 1 may have a rectangular shape with right-angled corners in a plan view, but is not limited thereto. Alternatively, the display device 1 may have a rectangular shape with rounded corners in a plan view.

The display device 1 may include a display panel 10. The display panel 10 may be flexible. The display panel 10 which is flexible may include a flexible substrate including a flexible polymer material such as polyimide. Accordingly, the display device 1 is bendable, foldable, or rollable and can be bent, folded, or rolled, respectively.

The display panel 10 may be an organic light-emitting display panel. The display panel 10 will hereinafter be described as being, for example, an organic light-emitting display panel, but is not limited thereto. Alternatively, various other display panels such as a liquid crystal display ("LCD") panel, a quantum-dot organic light-emitting display panel, a quantum-dot LCD panel, a nano-light-emitting display panel, a micro-light-emitting display panel may be used as the display panel 10.

The display panel 10 may include a display area DA which displays an image, and a non-display area NDA which does not display an image. The display panel 10 may be divided into the display area DA and the non-display area NDA in a plan view. The non-display area NDA is adjacent to the display area DA in the plan view. In an embodiment, the non-display area NDA may be disposed to surround the display area DA. The non-display area NDA may form the bezel of the display device 1.

The display area DA may have a rectangular shape with right-angled or rounded corners in a plan view, but the planar shape of the display area DA is not particularly limited. Alternatively, the display area DA may have various other shapes such as a circular or elliptical shape.

The display area DA may include a pixel PX provided in plural including a plurality of pixels PX. The pixels PX may be arranged in a matrix form within the display area DA. Each of the pixels PX may include a light-emitting layer EL and a circuit layer for controlling the amount of light emitted from the light-emitting layer EL. The circuit layer may include wiring, electrodes, and at least one transistor. The light-emitting layer EL may include an organic light-emitting material. The light-emitting layer EL may be sealed by an encapsulation film. The structure of the pixels PX will be described later.

The non-display area NDA may surround all sides of the display area DA and may form the edges of the display area DA, but is not limited thereto. A boundary may be defined where the non-display area NDA meets the display area DA.

The display panel 10 may include a main area MA and a bending area BA which is connected to a side of the main area MA in the second direction DR2. The display panel 10 may further include a subarea SA which is connected to a side of the bending area BA in the second direction DR2 and is bendable along a thickness direction of the display device 1 to overlap with the main area MA along the thickness direction. The main area MA, the bending area BA at which the display panel 10 is bendable and the subarea SA may be in order along the second direction DR2. Referring to FIG. 2, for example, the display panel 10 which is bent at the bending area BA may dispose the subarea SA overlapping with the main area MA along the thickness direction.

The display area DA may be located in the main area MA. The non-display area NDA may be located at edge parts of the main area MA extend along the display area DA. In an embodiment, the non-display area NDA may extend around the display area DA.

The main area MA may have a similar planar shape to the display device 1 in a plan view. The main area MA may be a flat area located in one plane, but is not limited thereto. Alternatively, one or more edges or sides of the main area MA (excluding the edge or side of the main area MA at which the bending area BA extends from the main area MA) may be curved or bent in a vertical direction.

In a case where one or more edges or sides of the main area MA (excluding the edge or side of the main area MA to which the bending area BA is connected) are curved or bent, the display area DA may also be disposed on the curved or bent edges or sides of the main area MA, but is not limited thereto. Alternatively, the non-display area NDA, or both the display area DA and the non-display area NDA, may be disposed on the curved or bent edges or sides of the main area MA.

The non-display area NDA of the main area MA may extend from the outer boundaries of the display area DA to the outer edges of the display panel 10. Signal lines or driving circuits for applying signals to the display area DA may be disposed in the non-display area NDA within the main area MA.

The bending area BA may be connected to or extend from the main area MA at one short side of the main area MA. A width of the bending area BA along the first direction DR1 may be smaller than ae width of the main area MA along the first direction DR1, particularly, corresponding to a length of the short sides of the main area MA. Part of the main area MA connected directly to the bending area BA may have an L shape to reduce the width of the bezel of the display device 1. A width of the bezel may extend in respective direction from the outer boundaries of the display area DA to the outer edges of the display panel 10.

In the bending area BA, the display panel 10 may be bendable to have curvature in a direction opposite to the display surface of the display panel 10. The display panel 10 which is bent at the bending area BA turns a portion of the display panel 10 upside down via the bending area BA. That is, the display panel 10 which is bent at the bending area BA disposes portions of the top surface of the display panel 10 to face upward, sideways and downward at the main area MA, the bending area BA and the subarea SA, respectively.

The subarea SA may extend from the bending area BA. Referring to FIG. 2, for example, the subarea SA may extend from a part of the display panel 10 at which the bending of the display panel 10 is complete (e.g., distal edge of bending area BA) and in a direction parallel to the main area MA. The subarea SA may overlap with or correspond to the main area MA along the thickness direction of the display panel 10. The subarea SA may overlap not only with the non-display area NDA, but also with the display area DA of the main area MA at an edge of the main area MA. Referring back to FIG. 1, along the first direction DR1, the width of the subarea SA may be the same as the width of the bending area BA, but is not limited thereto.

A pad unit may be disposed in the subarea SA of the display panel 10. An external device may be mounted or attached to the display panel 10 at the pad unit. Examples of the external device include a driving chip 20, a flexible printed circuit board and a rigid printed circuit board, and a wiring connecting film or a connector as the external device may also be mounted on the display panel 10 the pad unit. One or more external devices may be mounted or connected to the display panel 10 at the pad unit thereof in the subarea SA.

In one example, as illustrated in FIGS. 1 and 2, the driving chip 20 may be disposed in the subarea SA of the display panel 10, and a driving substrate 30 may be attached to the display panel 10 at a distal end of the subarea SA. In this example, the display panel 10 may include both a pad unit connected to the driving chip 20 and a pad unit connected to the driving substrate 30. In another example, the driving chip 20 may be mounted on a film, and the film may be attached to the display panel 10 at the subarea SA thereof.

The driving chip 20 may be mounted to the display panel 10 at the display surface of the display panel 10. Referring to FIG. 2, the display panel 10 which is bent and turned upside down via the bending area BA as described above, disposes the top surface of the driving chip 20 to face downward.

The driving chip 20 may be attached to the display panel 10 via an anisotropic conductive film or ultrasonic bonding. The driving chip 20 may include an integrated circuit for driving the display panel 10 to display an image, generate and/or emit light, etc.

Figure 3:
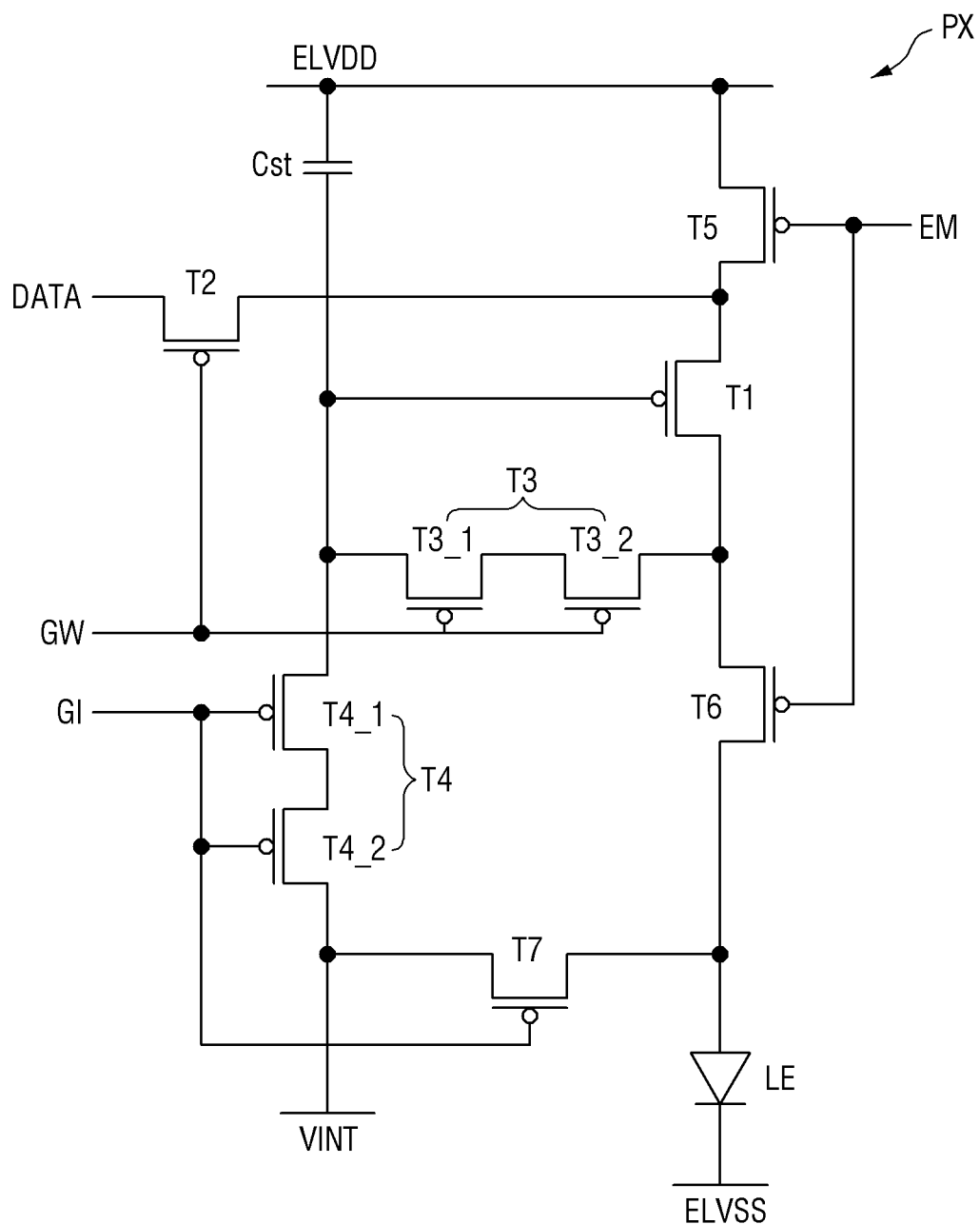
FIG. 3 is a circuit diagram of an embodiment of a pixel.

FIG. 3 is a circuit diagram of an embodiment of a pixel PX of the display panel 10.

Referring to FIG. 3, the circuitry of a pixel PX includes a plurality of transistors (T1 through T7), a capacitor Cst, and a light-emitting element LE. A data signal DATA, a first scan signal GW, a second scan signal GI, an emission control signal EM, a first power supply voltage ELVDD, a second power supply voltage ELVSS, and an initialization voltage VINT as various electrical signals are applied to the circuitry of the pixel PX.

The light-emitting element LE may be, for example, an organic light-emitting diode ("OLED") including a first electrode (or an anode ANO of FIG. 5), a light-emitting layer EL (of FIG. 5), and a second electrode (or a cathode electrode CAT of FIG. 5), but is not limited thereto.

The transistors (T1 through T7) may include first through seventh transistors T1 through T7. Each of the first through seventh transistors T1 through T7 includes a gate electrode, a first electrode, and a second electrode. One of the first and second electrodes of each of the first through seventh transistors T1 through T7 may be a source electrode, and the other electrode may be a drain electrode.

The first transistor T1 may serve as a driving transistor, and the second through seventh transistors T2 through T7 may serve as switching transistors.

The first through seventh transistors T1 through T7 may be thin-film transistors. The first through seventh transistors T1 through T7 may be P-type metal-oxide semiconductor ("PMOS") or N-type metal-oxide semiconductor ("NMOS") transistors. In one example, the first, second, third, fourth, fifth, sixth, and seventh transistors T1, T2, T3, T4, T5, T6, and T7 may be a driving transistor, a data transmission transistor, a compensation transistor, a first initialization transistor, a first emission control transistor, a second emission control transistor, and a second initialization transistor, respectively, and may all be PMOS transistors. However, the invention is not limited to this example.

In another example, the third and fourth transistors T3 and T4, which are a compensation transistor and a first initialization transistor, respectively, may be NMOS transistors, and the first, second, fifth, sixth, and seventh transistors T1, T2, T5, T6, and T7, which are a driving transistor, a data transmission transistor, a first emission control transistor, a second emission control transistor, and a second initialization transistor, respectively, may be PMOS transistors.

In this example, the active layers of the third and fourth transistors T3 and T4 may include a different material from the active layers of the first, second, fifth, sixth, and seventh transistors T1, T2, T5, T6, and T7. The active layers of the third and fourth transistors T3 and T4 may include, for example, an oxide semiconductor, and the active layers of the first, second, fifth, sixth, and seventh transistors T1, T2, T5, T6, and T7 may include, for example, polycrystalline silicon.

Each of the elements of the pixel PX will hereinafter be described.

The gate electrode of the first transistor T1 is connected to the first electrode of the capacitor Cst. The first electrode of the first transistor T1 is connected to a first power supply voltage terminal via the fifth transistor T5. The second electrode of the first transistor T1 is connected to the anode ANO of the light-emitting element LE via the sixth transistor T6. The first transistor T1 receives the data signal DATA and provides an electrical driving current to the light-emitting element LE in accordance with the switching operation of the second transistor T2.

The gate electrode of the second transistor T2 is connected to a first scan signal terminal. The first electrode of the second transistor T2 is connected to a data signal terminal. The second electrode of the second transistor T2 is connected to the first electrode of the first transistor T1 and is connected to the first power supply voltage terminal via the fifth transistor T5. The second transistor T2 is turned on by the first scan signal GW to perform a switching operation that transmits the data signal DATA to the first electrode of the first transistor T1.

The third transistor T3 may be formed as a dual transistor including first and second sub-transistors T3_1 and T3_2. The gate electrode of the first sub-transistor T3_1 is connected to the first scan signal terminal, the first electrode of the first sub-transistor T3_1 is connected to the second electrode of the second sub-transistor T3_2, and the second electrode of the first sub-transistor T3_1 is connected to the first electrode of the capacitor Cst, the first electrode of a third sub-transistor T4_1, and the gate electrode of the first transistor T1. The gate electrode of the second sub-transistor T3_2 is connected to the first scan signal terminal, the first electrode of the second sub-transistor T3_2 is connected to the second electrode of the first transistor T1, and the second electrode of the second sub-transistor T3_2 is connected to the first electrode of the first sub-transistor T3_1.

The first and second sub-transistors T3_1 and T3_2 are turned on by the first scan signal GW and may thus diode-connect the first transistor T1 by connecting the gate electrode and the second electrode of the first transistor T1. As a result, a voltage as much a voltage difference as the threshold voltage of the first transistor T1 arises between the first electrode and the gate electrode of the first transistor T1. This voltage difference may be compensated for by applying a data signal DATA having the threshold voltage of the first transistor T1 compensated for to the gate electrode of the first transistor T1.

The fourth transistor T4 may be formed as a dual transistor including third and fourth sub-transistors T4_1 and T4_2. The gate electrode of the third sub-transistor T4_1 is connected to a second scan signal terminal, the first electrode of the third sub-transistor T4_1 is connected to the first electrode of the capacitor Cst, the second electrode of the first sub-transistor T3_1, and the gate electrode of the first transistor T1, and the second electrode of the third sub-transistor T4_1 is connected to the first electrode of the fourth sub-transistor T4_2. The gate electrode of the fourth sub-transistor T4_2 is connected to the second scan signal terminal, the first electrode of the fourth sub-transistor T4_2 is connected to the second electrode of the third sub-transistor T4_1, and the second electrode of the fourth sub-transistor T4_2 is connected to the initialization voltage VINT. The third and fourth sub-transistors T4_1 and T4_2 are turned on by the second scan signal GI to perform an operation that initializes the voltage of the gate electrode of the first transistor T1 by transmitting the initialization voltage VINT to the gate electrode of the first transistor T1.

The gate electrode of the fifth transistor T5 is connected to an emission control signal terminal, the first electrode of the fifth transistor T5 is connected to a first driving voltage line (e.g., first power supply voltage terminal), and the second electrode of the fifth transistor T5 is connected to the first electrode of the first transistor T1. The fifth transistor T5 is turned on by the emission control signal EM to connect the first electrode of the first transistor T1 and the first driving voltage line.

The sixth transistor T6 is connected between the second electrode of the first transistor T1 and the first electrode of the light-emitting element LE. The gate electrode of the sixth transistor T6 is connected to the emission control signal terminal, the first electrode of the sixth transistor T6 is connected to the second electrode of the first transistor T1 and the first electrode of the second sub-transistor T3_2, and the second electrode of the sixth transistor T6 is connected to the first electrode of the light-emitting element LE.

The fifth and sixth transistors T5 and T6 are turned on at the same time by the emission control signal EM, and as a result, an electrical driving current flows into the light-emitting element LE.

The gate electrode of the seventh transistor T7 is connected to the second scan signal terminal. The first electrode of the seventh transistor T7 is connected to the anode ANO of the light-emitting element LE. The second electrode of the seventh transistor T7 is connected to the initialization voltage terminal. The seventh transistor T7 is turned on by the second scan signal GI to initialize the anode ANO of the light-emitting element LE.

The gate electrode of the seventh transistor T7 may receive the second scan signal GI. Alternatively, the gate electrode of the seventh transistor T7 may receive the emission control signal EM or a scan signal other than the first and second scan signals GW and GI.

The capacitor Cst is formed between the gate electrode of the first transistor T1 and the first driving voltage line and includes first and second electrodes. The first electrode of the capacitor Cst may be connected to the gate electrode of the first transistor T1, the second electrode of the third transistor T3, and the first electrode of the fourth transistor T4, and the second electrode of the capacitor Cst may be connected to the first driving voltage line. The capacitor Cst may uniformly maintain the data voltage applied to the gate electrode of the first transistor T1.

The cathode CAT of the light-emitting element LE is connected to a second power supply voltage terminal. As the light-emitting element LE receives an electrical driving current from the first transistor T1 and emits light, an image is displayed.

The cross-sectional structure and the plan view (e.g., layout) of the pixel PX will hereinafter be described.

Figure 4:
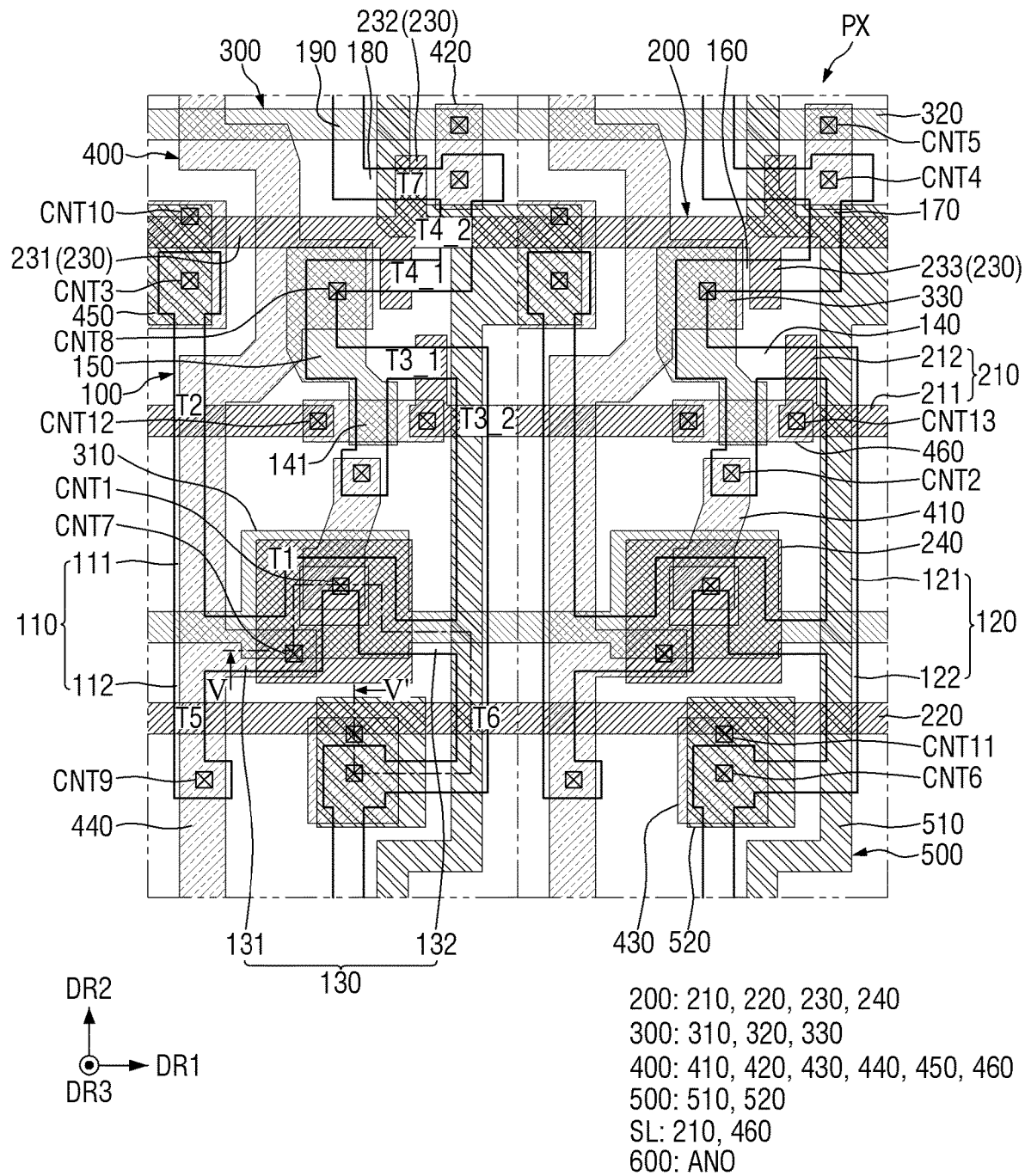
FIG. 4 is a plan view of the pixel of FIG. 3.
Figure 5:
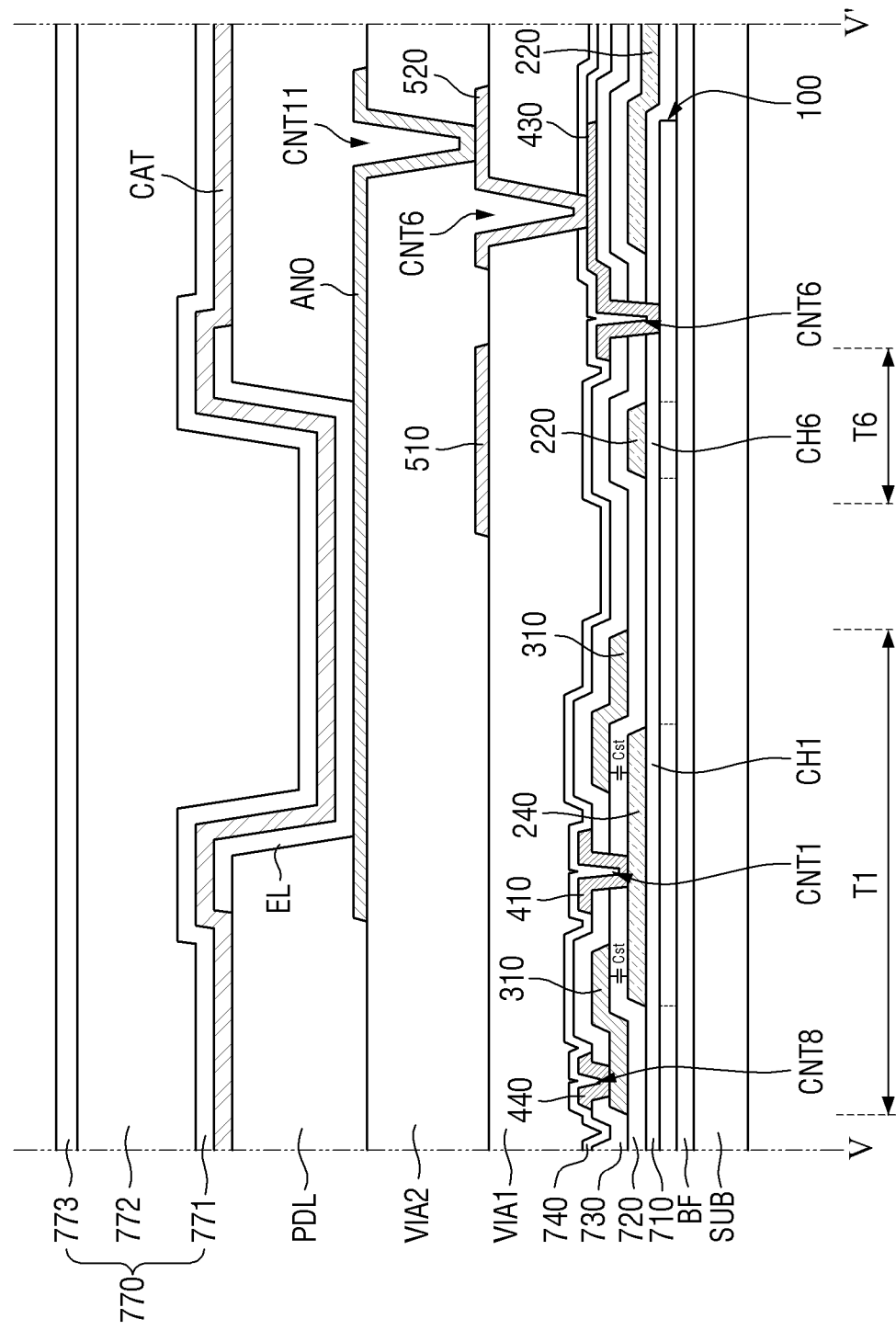
FIG. 5 is a cross-sectional view taken along line V-V' of FIG. 4.

FIG. 4 is a plan view of the pixel PX of FIG. 3. FIG. 5 is a cross-sectional view taken along line V-V' of FIG. 4. FIG. 5 is a cross-sectional view of the pixel PX of FIG. 4 and illustrates an anode ANO, a light-emitting layer EL, a cathode CAT, and a thin-film encapsulation layer 770 of the pixel PX of FIG. 4.

First, the cross-sectional structure of the pixel PX will hereinafter be described with reference to FIGS. 4 and 5.

As described above with reference to FIG. 3, the pixel PX includes the first through seventh transistors T1 through T7, the capacitor Cst, and the light-emitting element LE.

The capacitor Cst includes conductive layers forming or providing electrodes and an insulating layer which is disposed between the conductive layers. The light-emitting element LE includes conductive layers forming or forming an anode ANO and a cathode CAT and an organic light-emitting layer which is disposed between the conductive layers. The elements of the pixel PX may be electrically connected to one another through wires that are formed or provided by conductive layers and/or through vias that are formed of conductive materials. Conductive materials, conductive layers, semiconductor layers, insulating layers, and light-emitting element layers may be disposed on a substrate SUB.

The substrate SUB, a buffer layer BF, a semiconductor layer 100, a first insulating layer 710, a first conductive layer 200, a second insulating layer 720, a second conductive layer 300, a third insulating layer 730, a third conductive layer 400, a passivation layer 740, a first via layer VIA1, a fourth conductive layer 500, a second via layer VIA2, a fifth conductive layer 600, a pixel-defining film PDL (e.g., pixel-defining layer), the light-emitting layer EL, and the cathode CAT may be sequentially arranged in the pixel PX. These layers of the pixel PX may be formed as single-layer films or multilayer films, and other layers may be further disposed between the above-described layers of the pixel PX.

The substrate SUB supports the layers disposed thereon. A transparent substrate may be used in a bottom-emission or double-sided organic light-emitting display device. Not only a transparent substrate, but also a semitransparent or opaque substrate may be used in a front-emission organic light-emitting display device.

The substrate SUB may include or be formed of an insulating material such as glass, quartz, or a polymer resin. Examples of the polymer resin include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), and a combination thereof. Alternatively, the substrate SUB may include a metallic material.

The substrate SUB may be a rigid substrate or a flexible substrate that is bendable, foldable, or rollable. The substrate SUB may be formed of PI as a flexible substrate, but is not limited thereto.

The buffer layer BF may be disposed on the substrate SUB. The buffer layer BF may be disposed on the entire surface of the substrate SUB (e.g., on an entirety of a planar area the substrate SUB). The buffer layer BF may reduce or effectively prevent the diffusion of impurity ions and the penetration of moisture or the air from outside to overlying layers on the substrate SUB and may perform a surface planarization function. The buffer layer BF may include silicon nitride, but is not limited thereto. Alternatively, the buffer layer BF may include silicon oxide or silicon oxynitride. The buffer layer BF may not be provided (e.g., may be omitted) depending on the type of the substrate SUB or the conditions under which the substrate SUB is processed.

The semiconductor layer 100 may be disposed on the buffer layer BF. The semiconductor layer 100 may be an active layer forming first areas, second areas, and channels (or channel areas), which are in contact with the first and second electrodes of each of the first through seventh transistors T1 through T7. The first areas and the second areas become source areas and drain areas, respectively, or vice versa.

The first areas and the second areas may be considered a semiconductor area adjacent to the channel area, without being limited thereto. As being in contact, elements may for an interface therebetween, without being limited thereto. In an embodiment, for example, the display panel 10 may include a substrate SUB including a plurality of pixels PX and within a same pixel among the plurality of pixels PX, in order from the substrate, a semiconductor layer 100 including a channel area of a first transistor element and a semiconductor area adjacent to the channel area, a first insulation layer, a first conductive layer 200 including a plurality of split patterns 210 of a first scan line SL which are spaced apart from each other along the first scan line SL, the plurality of split patterns 210 including a split pattern 210 which faces the channel area of the first transistor element, a second insulation layer, a second conductive layer 300 including a shield pattern 330 which transmits a constant voltage, a third insulation layer, and a third conductive layer 400 including a scan connecting pattern 460 of the first scan line SL which electrically connects the plurality of split patterns 210 to each other and faces the semiconductor area which is adjacent to the channel area to define a scan overlapping area OA.

The semiconductor layer 100 may include polycrystalline silicon, which may be obtained by crystallizing amorphous silicon via, for example, rapid thermal annealing ("RTA"), solid phase crystallization ("SPC"), excimer laser annealing ("ELA"), metal induced crystallization ("MIC"), metal induced lateral crystallization ("MILC"), or sequential lateral solidification ("SLS"), but is not limited thereto. Alternatively, the semiconductor layer 100 may include monocrystalline silicon, low-temperature polycrystalline silicon, or amorphous silicon or may include an oxide semiconductor.

The first insulating layer 710 may be disposed on the semiconductor layer 100, substantially on the entire surface of the substrate SUB. The first insulating layer 710 may be a gate insulating film having a gate insulating function.

The first insulating layer 710 may include a silicon compound or a metal oxide. In one example, the first insulating layer 710 may include silicon oxide, silicon nitride, silicon oxynitride, aluminum oxide, tantalum oxide, hafnium oxide, zirconium oxide, or titanium oxide, and these oxides may be used alone or in combination.

The first conductive layer 200 is disposed on the first insulating layer 710. The first conductive layer 200 may include, in the pixel PX, split patterns 210 of a first scan line SL, a gate electrode pattern 240 of the first transistor T1, an emission control line 220, which transmits the emission control signal EM of FIG. 3, and a second scan line 230, which transmits the second scan signal GI of FIG. 3.

The first conductive layer 200 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 720 insulates the first and second conductive layers 200 and 300 from each other. The second insulating layer 720 may be disposed on the first conductive layer 200, substantially on the entire surface of the substrate SUB. The second insulating layer 720 may be an interlayer insulating film.

The second insulating layer 720 may include an inorganic insulating material such as silicon oxide, silicon nitride, silicon oxynitride, hafnium oxide, aluminum oxide, titanium oxide, tantalum oxide, or zinc oxide or an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene ("BCB").

The second conductive layer 300 is disposed on the second insulating layer 720. The second conductive layer 300 may include a capacitor electrode line 310, an initialization voltage line 320 which provides the initialization voltage VINT of FIG. 3, and a shield pattern 330.

The second conductive layer 300 may include at least one metal selected from Mo, Al, Pt, Pd, Ag, Mg, Au, Ni, Nd, Ir, Cr, Ca, Ti, Ta, W, and Cu.

The third insulating layer 730 may be disposed on the second conductive layer 300. The third insulating layer 730 may be disposed substantially on the entire surface of the substrate SUB. The third insulating layer 730 may be an interlayer insulating film. The third insulating layer 730 may include the same material as the second insulating layer 720 or may include at least one selected from among the above-mentioned materials of the second insulating layer 720.

The third conductive layer 400 is disposed on the third insulating layer 730. The third conductive layer 400 may include a plurality of data patterns, e.g., first and second data patterns 410 and 420, a first anode connecting electrode 430 which electrically connects the anode ANO of the light-emitting element LE of FIG. 3 and the semiconductor layer 100 to each other, a first power supply voltage line 440 which provides the first power supply voltage ELVDD, a data connecting pattern 450 which electrically connects a data line 510 and the semiconductor layer 100 to each other, and a scan connecting pattern 460 of the first scan line SL which electrically connects a pair of adjacent split patterns 210 of the first scan line SL to each other. Referring to FIG. 4, a first split pattern (e.g., left side of the pixel PX) and a second split pattern (e.g., right side of the pixel PX) are spaced apart from each other along the scan line. That is, the first scan line SL may include the split patterns 210 and the scan connecting pattern 460 arranged along the first scan line SL.

The third conductive layer 400 may include at least one metal selected from Mo, Al, Pt, Pd, Ag, Mg, Au, Ni, Nd, Ir, Cr, Ca, Ti, Ta, W, and Cu. The third conductive layer 400 may be a single-layer film or a multilayer film. In one example, the third conductive layer 400 may be formed as a stack such as Ti/Al/Ti, Mo/Al/Mo, Mo/AlGe/Mo, or Ti/Cu.

The passivation layer 740 may be formed on the third conductive layer 400. The passivation layer 740 may be formed as an inorganic film such as, for example, a silicon nitride layer, a silicon oxynitride layer, a silicon oxide layer, a titanium oxide layer, or an aluminum oxide layer. In some embodiments, the passivation layer 740 may not be provided.

The first via layer VIA1 is disposed on the passivation layer 740. The first via layer VIA1 may be a planarization film. The first via layer VIA1 may include an inorganic insulating material or an organic insulating material such as an acrylic resin, an epoxy resin, a phenolic resin, a polyamide resin, a polyimide resin, an unsaturated polyester resin, a polyphenylene resin, a polyphenylene sulfide resin, or BCB.

The fourth conductive layer 500 is disposed on the first via layer VIA1. The fourth conductive layer 500 may include the data line 510 which transmits the data signal DATA of FIG. 3, and a second anode connecting electrode 520 which electrically connects the anode ANO of the light-emitting element LE and the semiconductor layer 100 to each other.

The fourth conductive layer 500 may include at least one metal selected from Mo, Al, Pt, Pd, Ag, Mg, Au, Ni, Nd, Ir, Cr, Ca, Ti, Ta, W, and Cu.

The second via layer VIA2 is disposed on the fourth conductive layer 500. The second via layer VIA2 may be a planarization film. The second via layer VIA2 may include an inorganic insulating material or an organic insulating material such as an acrylic resin, an epoxy resin, a phenolic resin, a polyamide resin, a polyimide resin, an unsaturated polyester resin, a polyphenylene resin, a polyphenylene sulfide resin, or BCB.

The fifth conductive layer 600 is disposed on the second via layer VIA2. The fifth conductive layer 600 includes the anode ANO. The anode ANO may be disposed in each of the pixels PX to be separated from adjacent anodes, between different pixels PX. The anode ANO may be electrically connected to the second anode connecting electrode 520 through a second anode contact hole CNT11, which penetrates the second via layer VIA2 to expose the second anode connecting electrode 520 to outside the second via layer VIA2.

The anode ANO may have a structure in which a layer of a high-work function material such as indium tin oxide ("ITO"), indium zinc oxide ("IZO"), zinc oxide (ZnO), or indium oxide ($In_2O_3$) and a layer of a reflective material such as Ag, Mg, Al, Pt, lead (Pb), gold (Au), Ni, Nd, Ir, Cr, Li, Ca, or a combination thereof are stacked. The high-work function material layer may be disposed above the reflective material layer, closer to the light-emitting layer EL. The anode ANO may have a multilayer structure of ITO/Mg, ITO/MgF, ITO/Ag, or ITO/Ag/ITO, but is not limited thereto.

The pixel-defining film PDL may be disposed on the fifth conductive layer 600. The pixel-defining film PDL may include or define an opening exposing part of the anode electrode ANO to outside the pixel-defining layer. The pixel-defining film PDL may be formed of an organic insulating material or an inorganic insulating material. In one example, the pixel-defining film PDL may include at least one of a polyimide resin, an acrylic resin, a silicon compound, and a polyacrylic resin.

The light-emitting layer EL is disposed on the part of the anode ANO exposed by the pixel-defining film PDL to outside thereof. The light-emitting layer EL may include an organic material layer. The organic material layer of the light-emitting layer EL may include an organic emission layer and may further include a hole injection/transport layer and/or an electron injection/transport layer.

The cathode CAT may be disposed on the light-emitting layer EL. The cathode CAT may be a common electrode disposed on the entire surface of the substrate SUB across different pixels PX. The anode ANO, the light-emitting layer EL, and the cathode electrode CAT may together form an organic light-emitting element as a light-emitting element LE.

The cathode CAT may include a layer of a low-work function material such as Li, Ca, LiF/Ca, LiF/Al, Al, Mg, Ag, Pt, Pd, Ni, Au Nd, Ir, Cr, BaF, Ba, or a compound or combination thereof (e.g., the combination of Ag and Mg). The cathode CAT may further include a transparent metal oxide layer disposed on the low-work function material layer.

The thin-film encapsulation layer 770 is disposed on the cathode CAT and includes a first inorganic film 771, a first organic film 772, and a second inorganic film 773. The first and second inorganic films 771 and 773 may be in contact with each other at an end of the thin-film encapsulation layer 770. The first organic film 772 may be sealed by the first and second inorganic films 771 and 773.

The first and second inorganic films 771 and 773 may include silicon nitride, silicon oxide, or silicon oxynitride. The first organic film 772 may include an organic insulating material.

The plan view of the pixel PX will hereinafter be further described.

Figure 6:
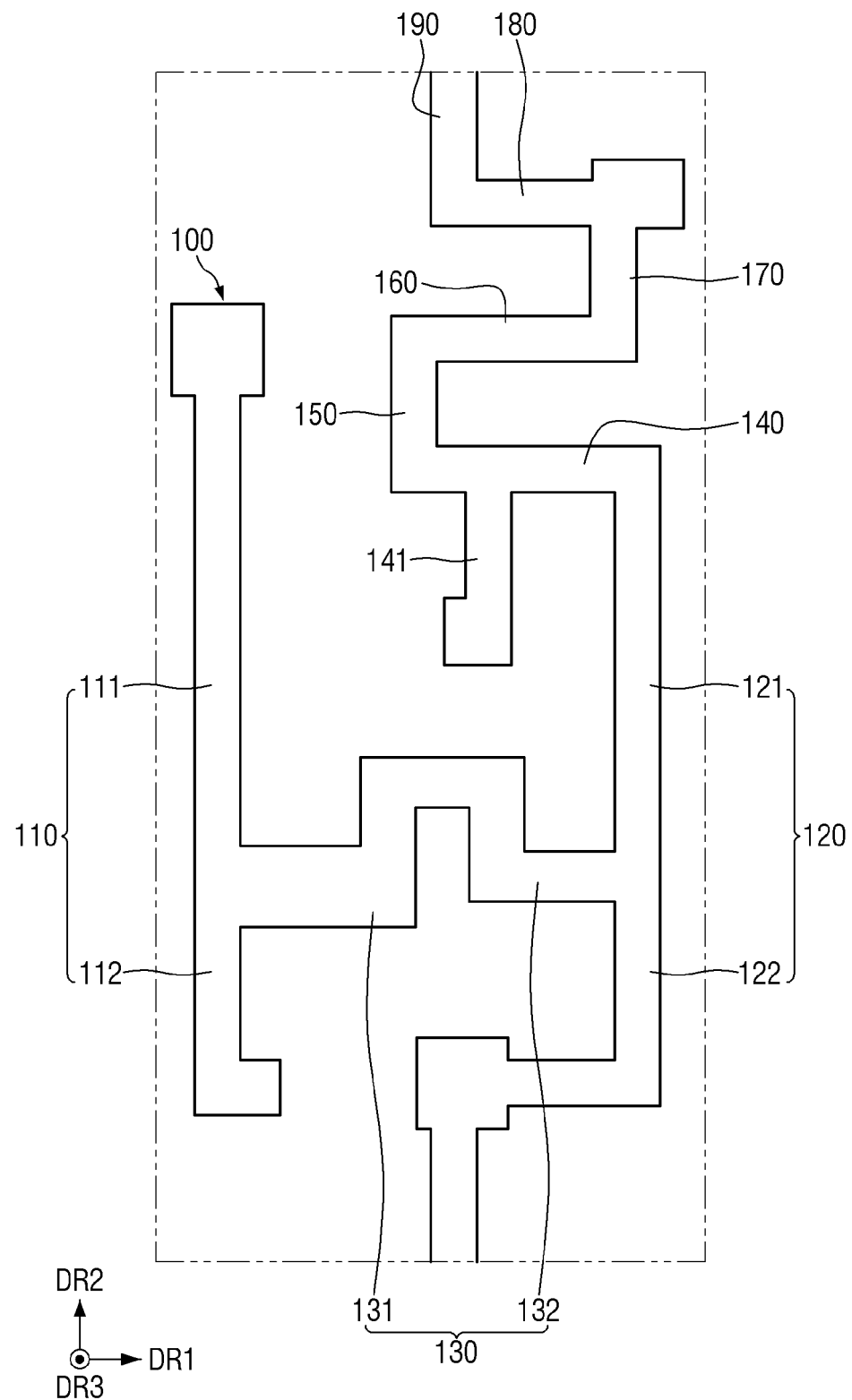
FIG. 6 is a plan view of an embodiment of a semiconductor layer of the pixel of FIG. 4.

FIG. 6 is a plan view of an embodiment of a semiconductor layer 100 of the pixel PX of FIG. 4.

Referring to FIGS. 4 and 6, the semiconductor layer 100 may not be separated or disconnected between different pixels PX but may be connected across different pixels PX. The semiconductor layer 100 may have a pattern in a plan view. In one example, the semiconductor layer 100 may include first, second, third, fourth, and fifth vertical parts 110, 120, 150, 170, and 190 (e.g., vertical portion provided in plural including a plurality of vertical portions), which generally extend along the second direction DR2, first, second, third, and fourth horizontal parts 130, 140, 160, and 180 (e.g., horizontal portion provided in plural including a plurality of horizontal portions), which generally extend along the first direction DR1, and a protruding part 141 which protrudes in the second direction DR2 from the second horizontal part 140. The first, second, third, fourth, and fifth vertical parts 110, 120, 150, 170, and 190, the first, second, third, and fourth horizontal parts 130, 140, 160, and 180, and the protruding part 141 may be physically connected to one another to provide a single semiconductor pattern.

The first vertical part 110 may be disposed adjacent to a second side along the first direction DR1 of the pixel PX, and the second vertical part 120 may be disposed to a first side along the first direction DR1 of the pixel PX which is opposite to the second side along the first direction DR1. The first and second vertical parts 110 and 120 may be disposed to be spaced apart from each other. The first vertical part 110 may be longer than the second vertical part 120 along the second direction DR2. The first horizontal part 130 may connect the middle portions of the first and second vertical parts 110 and 120 to each other.

Upper portions 111 and 121 of the first and second vertical parts 110 and 120 may refer to portions of the first and second vertical parts 110 and 120 that are closer to the first side than the first horizontal part 130 along the second direction DR2 of the pixel PX, and lower portions 112 and 122 of the first and second vertical parts 110 and 120 may refer to portions of the first and second vertical parts 110 and 120 that are closer to a second side than the first horizontal part 130 along the second direction DR2 of the pixel PX. The first and second vertical parts 110 and 120 and the first horizontal part 130 may form a substantially H shape in a plan view.

The first side and the second side along the second direction DR2 may be respectively referred to as a third side and a fourth side of the pixel PX, without being limited thereto.

The first horizontal part 130 may connect the first and second vertical parts 110 and 120 by the shortest distance, but may include a first bent portion 131 on the second side along the first direction DR1 of the pixel PX and a second bent portion 132 on the first side along the first direction DR1 of the pixel PX. The first horizontal part 130 may be bent multiple times so that the total length of the first horizontal part 130 may increase as compared to the shortest distance between the first and second vertical parts 110 and 120.

The second horizontal part 140 may extend from a first end, in the second direction DR2, of the upper portion 121 of the second vertical part 120 to the second side, in a direction opposite to the first direction DR1, of the pixel PX and may be disposed closer than the first horizontal part 130 to the first side, in the second direction DR2, of the pixel PX.

The protruding part 141 may protrude from the second horizontal part 140 toward the second side, in a direction opposite to the second direction DR2, of the pixel PX. The protruding part 141 may protrude from the second horizontal part 140 toward the first horizontal part 130. The protruding part 141 may be disposed between the first and second vertical parts 110 and 120, but is not limited thereto. The protruding part 141 may extend further than a first side, along the second direction DR2, of the scan connecting pattern 460 and further than a second side, along the second direction DR2 of the scan connecting pattern 460, but may neither overlap with, nor intersect, the split patterns 210. As a result, even though a scan signal is applied to the first scan line SL, the influence of the scan signal on the protruding part 141 of the semiconductor layer 100 can be reduced.

The protruding part 141 may overlap with, and intersect, the scan connecting pattern 460. As the shield pattern 330 is disposed between the protruding part 141 and the scan connecting pattern 460, the influence of a scan signal applied to the scan connecting pattern 460 on the protruding part 141 can be suppressed or prevented, and this will be described later.

An entirety of the semiconductor layer 100 except for the channel areas of the first through seventh transistors T1 through T7 may be doped with impurity ions. In one example, in a case where the first through seventh transistors T1 through T7 are NMOS transistors, the first areas and the second areas of the first through seventh transistors T1 through T7 may be doped with N-type impurity ions, and in a case where the first through seventh transistors T1 through T7 are PMOS transistors, the first areas and the second areas of the first through seventh transistors T1 through T7 may be doped with P-type impurity ions. As described above, the first areas and the second areas of a respective transistor among the first through seventh transistors T1 through T7 become a source area and a drain area, respectively. Within a same transistor, the first area and the second area thereof may be on opposing sides of a channel area of the same transistor.

In this example, at least part of the semiconductor layer 100 that overlaps with the first scan line SL may be doped with impurity ions. In other words, part of the semiconductor layer 100 that overlaps with the split patterns 210 may not be doped with impurity ions, and part of the semiconductor layer 100 that overlaps with the scan connecting pattern 460 may be doped with impurity ions. In one example, the protruding part 141 may be doped with impurity ions. Even though the protruding part 141 overlaps with the first scan line SL, the protruding part 141 may be doped with impurity ions in the overlapping area of the protruding part 141 and the first scan line SL.

The third vertical part 150 may extend from a second end, in the first direction DR1, of the second horizontal part 140 to the first side, in the second direction DR2, of the pixel PX. The third vertical part 150 may be disposed on a first side, in the first direction DR1, of the first vertical part 110, but is not limited thereto.

The third horizontal part 160 may extend from a first end, in the first direction DR1, of the third vertical part 150 to the first side, in the first direction DR1, of the pixel PX. The third horizontal part 160 may be disposed on a first side, in the second direction DR2, of the second horizontal part 140, but is not limited thereto.

The fourth vertical part 170 may extend from a first end, in the first direction DR1, of the third horizontal part 160 to the first side, in the second direction DR2, of the pixel PX. The fourth vertical part 170 may be disposed on a first side, in the first direction DR1, of the second vertical part 120, but is not limited thereto.

The fourth horizontal part 180 may extend from a first end, in the first direction DR1, of the fourth vertical part 170 to the second side, in the first direction DR1, of the pixel PX. The fourth horizontal part 180 may be disposed on a first side, in the second direction DR2, of the third horizontal part 160, but is not limited thereto.

The fifth vertical part 190 may extend from a second end, in the first direction DR1, of the fourth horizontal part 180 to the first side, in the second direction DR2, of the pixel PX. The fifth vertical part 190 may be physically connected to a second vertical part 120 of the semiconductor layer 100 disposed on the first side, in the second direction DR2, of the pixel PX. That is, a first end, in the second direction DR2, of the fifth vertical part 190 may be connected to a lower portion 122 of a second vertical part 120 of an upper neighboring pixel PX.

In FIG. 4, a respective channel of a transistor is indicated with a same reference numeral as the transistor. The channel of the second transistor T2 may be disposed in the upper portion 111 of the first vertical part 110, and the channel of the fifth transistor T5 may be disposed in the lower portion 112 of the first vertical part 110. The channel of the second sub-transistor T3_2 may be disposed in the upper portion 121 of the second vertical part 120 and the channel of the sixth transistor T6 (e.g., sixth channel CH6) may be disposed in the lower portion 122 of the second vertical part 120. The channel of the first transistor T1 (e.g., first channel CH1) may be disposed in the first horizontal part 130. The channel of the first sub-transistor T3_1 may be disposed in the second horizontal part 140. The channel of the third sub-transistor T4_1 may be disposed in the third horizontal part 160, and the channel of the fourth sub-transistor T4_2 may be disposed in the fourth vertical part 170. The channel of the seventh transistor T7 may be disposed in the fourth horizontal part 180.

Figure 7:
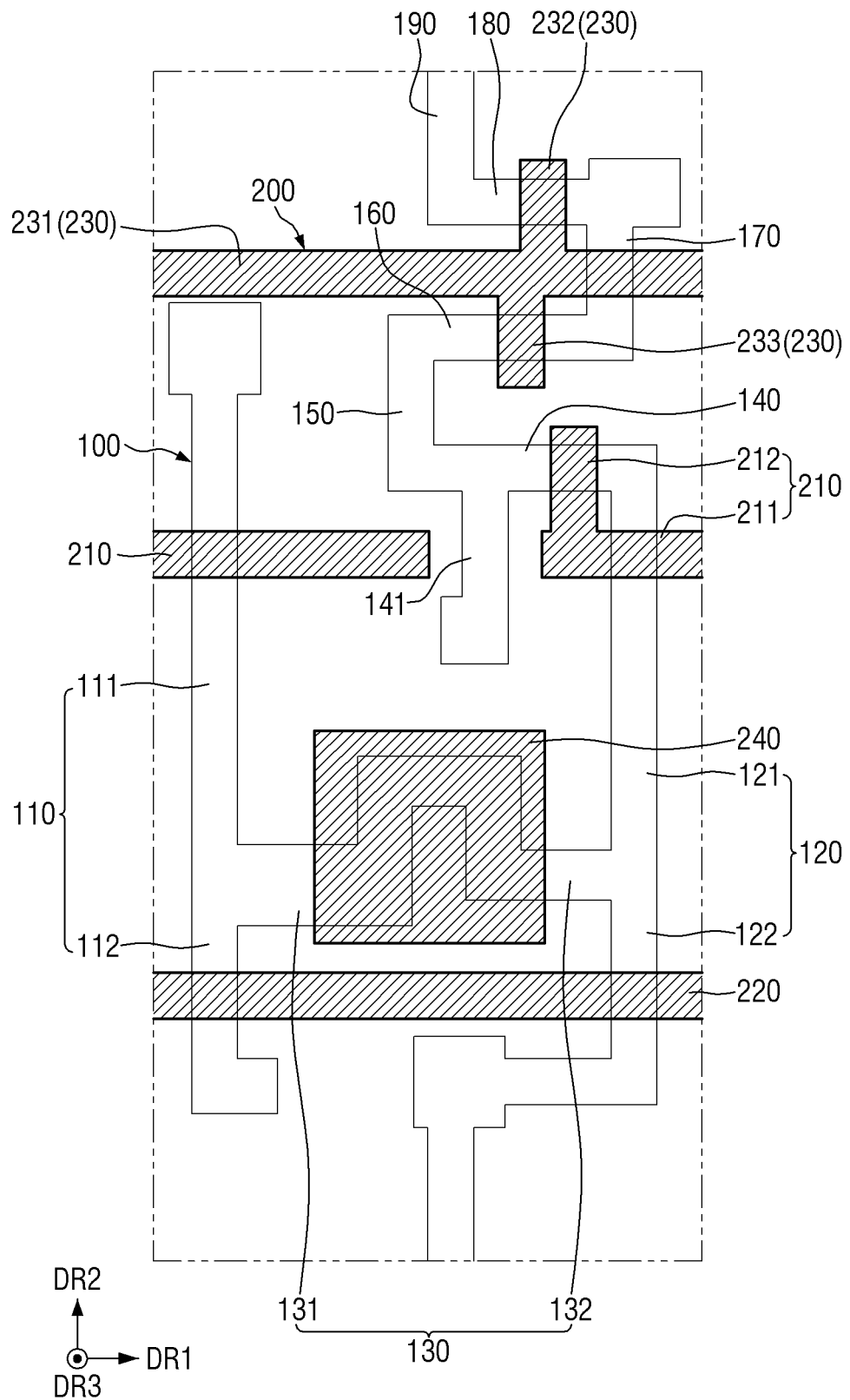
FIG. 7 is a plan view illustrating an embodiment of the semiconductor layer and a first conductive layer of the pixel of FIG. 4.

FIG. 7 is a plan view illustrating an embodiment of the semiconductor layer 100 and the first conductive layer 200 of the pixel PX of FIG. 4.

Referring to FIGS. 4 and 7, the first scan line SL may include the gate electrode of the second transistor T2, the gate electrode of the first sub-transistor T3_1, and the gate electrode of the second sub-transistor T3_2, and the emission control line 220 may include the gate electrode of the fifth transistor T5 and the gate electrode of the sixth transistor T6. The second scan line 230 may include the gate electrode of the third sub-transistor T4_1, the gate electrode of the fourth sub-transistor T4_2, and the gate electrode of the seventh transistor T7. Parts of the semiconductor layer 100 that overlap with the gate electrodes of the first through seventh transistors T1 through T7 may include or define the respective channels of the first through seventh transistors T1 through T7.

The first scan line SL, the emission control line 220, and the second scan line 230 may extend along the first direction DR1. The first scan line SL, the emission control line 220, and the second scan line 230 on one of the pixels PX may extend along the first direction DR1 into other neighboring pixels PX, beyond the boundaries of the one of the pixels PX.

A plurality of split patterns 210 may be separate and spaced apart from each other. In other words, the plurality of split patterns 210 may have an island shape in a plan view. In the pixel PX, the pair of adjacent split patterns 210 may be electrically connected to each other by the scan connecting pattern 460. The split patterns 210 may extend into neighboring pixels PX, beyond the boundaries of the pixel PX. The split patterns 210 may include the gate electrodes of first and second sub-transistors T3_1 and T3_2 in the overlapping areas of the split patterns 210 and the semiconductor layer 100.

The protruding part 141 of the semiconductor layer 100 may be disposed between the split patterns 210. In other words, the first scan line SL and the protruding part 141 of the semiconductor layer 100 may not overlap with each other. As a result, the influence of a signal applied to the first scan line SL on the semiconductor layer 100 can be reduced. In other words, even if a scan signal is applied to the first scan line SL, the influence of the scan signal on the semiconductor layer 100 can be reduced since the protruding part 141 does not overlap with the split patterns 210.

Each of the split patterns 210 may include a first base part 211, which extends in the first direction DR1, and a first protruding part 212, which extends in the second direction DR2 from the first base part 211.

The first scan line SL may be located near the center of the pixel PX and may overlap with the upper portions 111 and 121 of the first and second vertical parts 110 and 120 of the semiconductor layer 100 and with the second horizontal part 140 of the semiconductor layer 100.

Specifically, the first base part 211 may form the gate electrode of the second transistor T2 in the overlapping area of the first base part 211 and the upper portion 111 of the first vertical part 110. Part of the first vertical part 110 on a first side, in the second direction DR2, of the overlapping area of the first base part 211 and the upper portion 111 of the first vertical part 110 may become the first area of the second transistor T2, and part of the first vertical part 110 on a second side, in the second direction DR2, of the overlapping area of the first base part 211 and the upper portion 111 of the first vertical part 110 may become the second area of the second transistor T2.

The first base part 211 may form the gate electrode of the second sub-transistor T3_2 in the overlapping area of the first base part 211 and the upper portion 121 of the second vertical part 120. Part of the second vertical part 120 on a first side, in the second direction DR2, of the overlapping area of the first base part 211 and the upper portion 121 of the second vertical part 120 may become the second area of the second sub-transistor T3_2, and part of the second vertical part 120 on a second side, in the second direction DR2, of the overlapping area of the first base part 211 and the upper portion 121 of the second vertical part 120 may become the first area of the second sub-transistor T3_2.

The first protruding part 212 may overlap with the second horizontal part 140 of the semiconductor layer 100 and may form the gate electrode of the first sub-transistor T3_1 in the overlapping area of the first protruding part 212 and the second horizontal part 140. Part of the second horizontal part 140 on a first side, in the first direction DR1, of the overlapping area of the first protruding part 212 and the second horizontal part 140 may become the first area of the first sub-transistor T3_1, and part of the second horizontal part 140 on a second side, in the first direction DR1, of the overlapping area of the first protruding part 212 and the second horizontal part 140 may become the second area of the first sub-transistor T3_1.

In a plan view, the emission control line 220 may be located on the second side, in the second direction DR2, of the pixel PX and may overlap with the lower portions 112 and 122 of the first and second vertical parts 110 and 120 of the semiconductor layer 100.

The emission control line 220 may form the gate electrode of the fifth transistor T5 in the overlapping area of the emission control line 220 and the lower portion 112 of the first vertical part 110. Part of the first vertical part 110 on a first side, in the second direction DR2, of the overlapping area of the emission control line 220 and the lower portion 112 of the first vertical part 110 may become the second area of the fifth transistor T5, and part of the first vertical part 110 on a second side, in the second direction DR2, of the overlapping area of the emission control line 220 and the lower portion 112 of the first vertical part 110 may become the first area of the fifth transistor T5.

The emission control line 220 may form the gate electrode of the sixth transistor T6 in the overlapping area of the emission control line 220 and the lower portion 122 of the second vertical part 120. Part of the second vertical part 120 on a first side, in the second direction DR2, of the overlapping area of the emission control line 220 and the lower portion 122 of the second vertical part 120 may become the first area of the sixth transistor T6, and part of the second vertical part 120 on a second side, in the second direction DR2, of the overlapping area of the emission control line 220 and the lower portion 122 of the second vertical part 120 may become the second area of the sixth transistor T6.

The second scan line 230 may include, in the pixel PX, a second base part 231, which extends in the first direction DR1, and second and third protruding parts 232 and 233, which respectively protrude from opposing sides, in the second direction DR2, of the second base part 231.

In a plan view, the second scan line 230 may be located on the first side, in the second direction DR2, of the pixel PX and may overlap with the third, fourth, and fifth vertical parts 150, 170, and 190 of the semiconductor layer 100.

Specifically, the second base part 231 of the second scan line 230 may form the gate electrode of the fourth sub-transistor T4_2 in the overlapping area of the second base part 231 and the fourth vertical part 170. Part of the fourth vertical part 170 on a first side, in the second direction DR2, of the overlapping area of the second base part 231 and the fourth vertical part 170 may become the second area of the fourth sub-transistor T4_2, and part of the fourth vertical part 170 on a second side, in the second direction DR2, of the overlapping area of the second base part 231 and the fourth vertical part 170 may become the first area of the fourth sub-transistor T4_2.

The second protruding part 232 of the second scan line 230 may form the gate electrode of the seventh transistor T7 in the overlapping area of the second protruding part 232 and the fourth horizontal part 180 of the semiconductor layer 100. Part of the fourth horizontal part 180 on a first side, in the first direction DR1, of the overlapping area of the second protruding part 232 and the fourth horizontal part 180 may become the second area of the seventh transistor T7, and part of the fourth horizontal part 180 on a second side, in the first direction DR1, of the overlapping area of the second protruding part 232 and the fourth horizontal part 180 may become the first area of the seventh transistor T7.

The third protruding part 233 of the second scan line 230 may form the gate electrode of the third sub-transistor T4_1 in the overlapping area of the third protruding part 233 and the third horizontal part 160 of the semiconductor layer 100. Part of the third horizontal part 160 on a first side, in the first direction DR1, of the overlapping area of the third protruding part 233 and the third horizontal part 160 may become the second area of the third sub-transistor T4_1, and part of the third horizontal part 160 on a second side, in the first direction DR1, of the overlapping area of the third protruding part 233 and the third horizontal part 160 may become the first area of the third sub-transistor T4_1.

As the second base part 231 of the second scan line 230 extends along the first direction DR1 and the second and third protruding parts 232 and 233 of the second scan line 230 protrude along the second direction DR2 from the second base part 231, part of the semiconductor layer 100 between the channel area of the fourth sub-transistor T4_2 and the channel area of the seventh transistor T7 may be located on a first side, in the second direction DR2, of the second base part 231 of the second scan line 230. Accordingly, the second data pattern 420 may not overlap with the second scan line 230, and the influence of the second scan line 230 on the second data pattern 420 can be reduced.

The gate electrode pattern 240 of the first transistor T1 may be located in the middle of the pixel PX. The gate electrode pattern 240 of the first transistor T1 may be located between the first scan line SL and the emission control line 220 in a plan view. The gate electrode pattern 240 of the first transistor Ti may be separate from another gate electrode pattern between different pixels PX.

The gate electrode pattern 240 of the first transistor Ti overlaps with the first horizontal part 130 of the semiconductor layer 100. The gate electrode pattern 240 of the first transistor T1 includes the gate electrode of the first transistor T1 in the overlapping area of the gate electrode pattern 240 and the first horizontal part 130. Part of the first horizontal part 130 on a second side, in the first direction DR1, of the overlapping area of the gate electrode pattern 240 and the first horizontal part 130 may become the first area of the first transistor T1, and part of the first horizontal part 130 on a first side, in the first direction DR1, of the overlapping area of the gate electrode pattern 240 and the first horizontal part 130 may become the second area of the first transistor T1.

The gate electrode pattern 240 of the first transistor T1 may be electrically connected to the protruding part 141 of the semiconductor layer 100 through the first data pattern 410.

Figure 8:
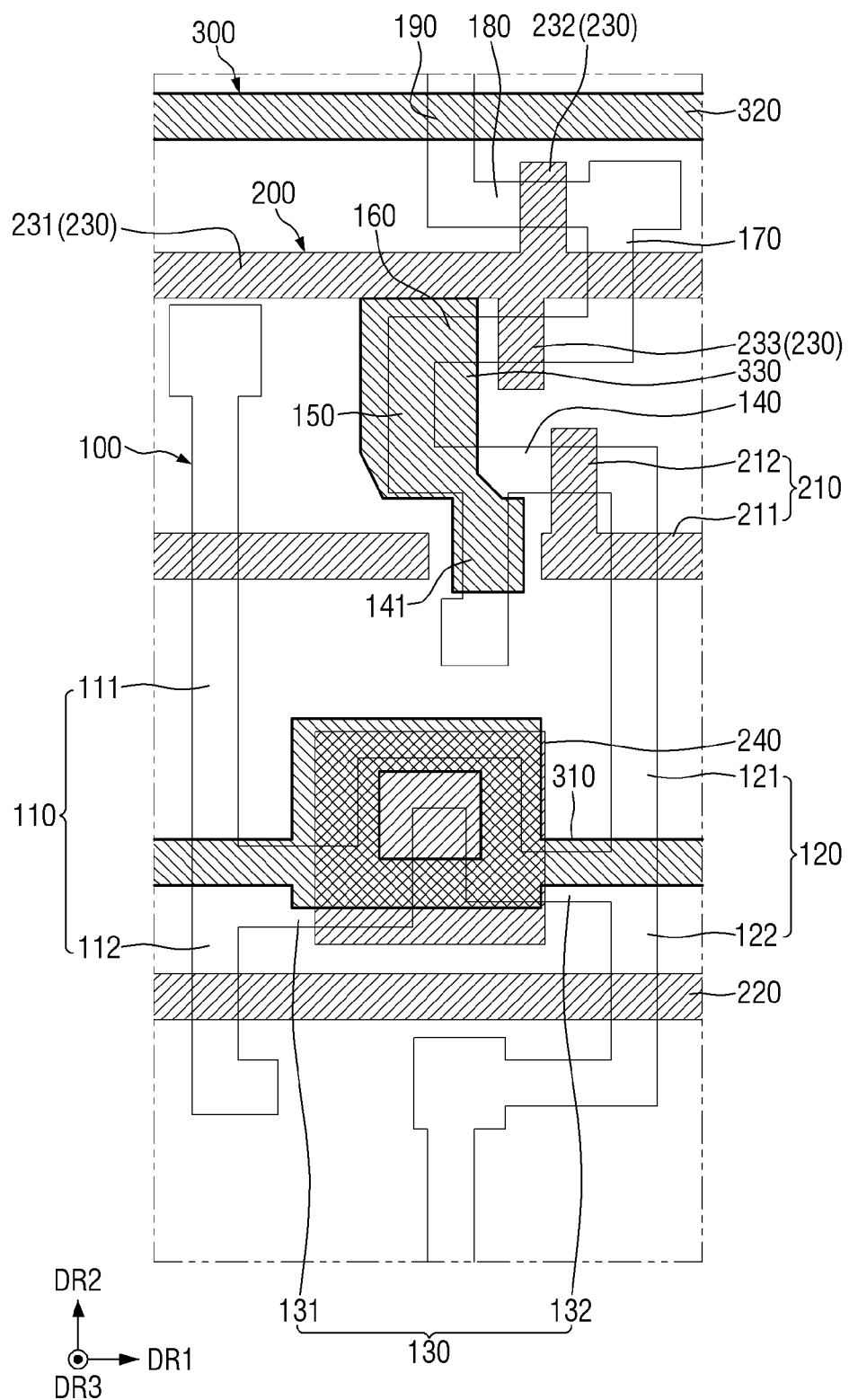
FIG. 8 is a plan view illustrating an embodiment of the semiconductor layer, the first conductive layer, and a second conductive layer of the pixel of FIG. 4.

FIG. 8 is a plan view illustrating an embodiment of the semiconductor layer 100, the first conductive layer 200, and the second conductive layer 300 of the pixel PX of FIG. 4.

Referring to FIGS. 4 and 8, the capacitor electrode line 310 and the initialization voltage line 320 may extend along the first direction DR1. The capacitor electrode line 310 and the initialization voltage line 320 may extend along the first direction DR1 into neighboring pixels PX, beyond the boundaries of the pixel PX.

The capacitor electrode line 310 may pass through the middle of the pixel PX and may be disposed to overlap with the gate electrode pattern 240 of the first transistor T1 with the second insulating layer 720 interposed therebetween to form the capacitor Cst. The gate electrode pattern 240 of the first transistor T1 may become the first electrode of the capacitor Cst, an extension of the capacitor electrode line 310 that overlaps with the gate electrode pattern 240 may become the second electrode of the capacitor Cst, and the second insulating layer 720, which is interposed between the gate electrode pattern 240 and the capacitor electrode line 310, may become the dielectric body of the capacitor Cst.

The capacitor electrode line 310 may be expanded in the overlapping area of the capacitor electrode line 310 and the gate electrode pattern 240 of the first transistor T1, to define an expanded portion of the capacitor electrode line 310. The expanded portion of the capacitor electrode line 310 may include or define an opening overlapping with the gate electrode pattern 240 of the first transistor T1.

The initialization voltage line 320 may be located on the first side, in the second direction DR2, of the pixel PX in a plan view. The initialization voltage line 320 may overlap with the fifth vertical part 190 of the semiconductor layer 100. The initialization voltage line 320 may be electrically connected to the semiconductor layer 100 through the second data pattern 420. The initialization voltage line 320 may be electrically connected to the part of the semiconductor layer 100 which is between the channel of the fourth sub-transistor T4_2 and the channel of the seventh transistor T7 through the second data pattern 420.

Figure 9:
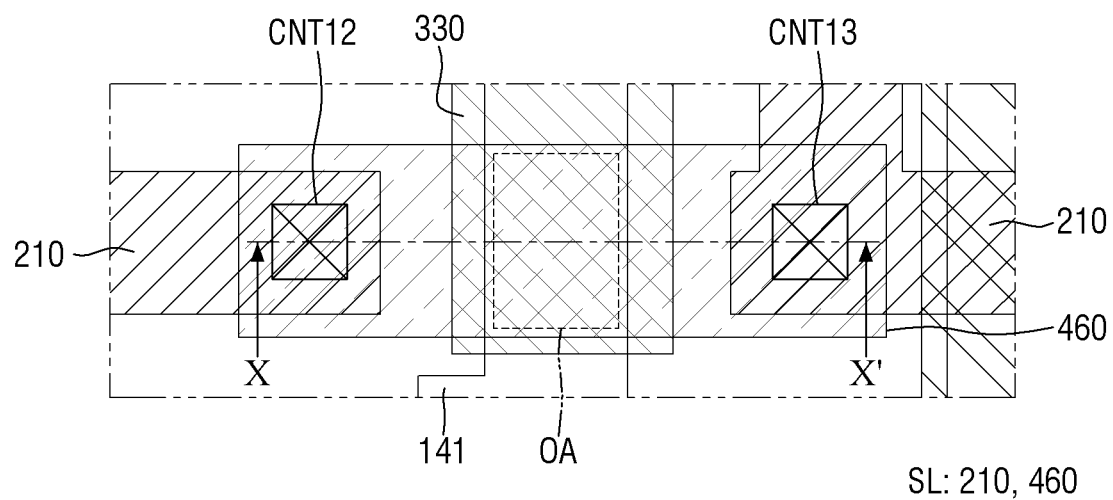
FIG. 9 is an enlarged plan view of the pixel of FIG. 4.
Figure 10:
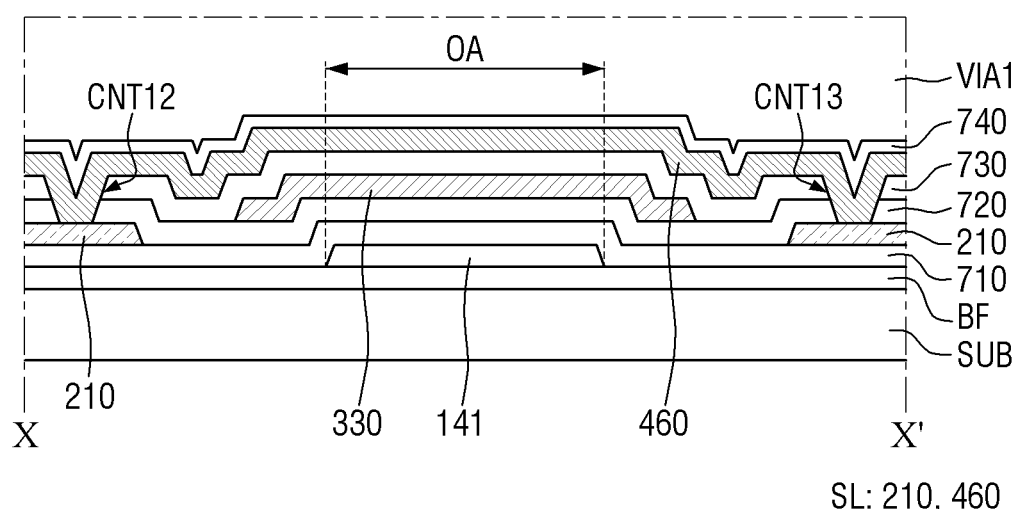
FIG. 10 is a cross-sectional view taken along line X-X' of FIG. 9.

FIG. 9 is an enlarged plan view of the pixel PX of FIG. 4. FIG. 10 is a cross-sectional view taken along line X-X' of FIG. 9. FIG. 9 illustrates an area adjacent to the scan connecting pattern 460 of FIG. 4.

Referring to FIGS. 9 and 10, the shield pattern 330 may be located in the middle of the pixel PX in a plan view. The shield pattern 330 may be disposed between the gate electrode pattern 240 of the first transistor T1 and the initialization voltage line 320. The shield pattern 330 may be separate between different pixels PX. The shield pattern 330 may be electrically connected to the first power supply voltage line 440 and may thus receive the first power supply voltage ELVDD.

The shield pattern 330 may be disposed between the protruding part 141 of the semiconductor layer 100 and the scan connecting pattern 460, in the thickness direction (e.g., the third direction DR3). The shield pattern 330 may block an electrical signal at the protruding part 141 of the semiconductor layer 100 from the scan connecting pattern 460.

In other words, the display device 1 may further include a scan overlapping area OA where the protruding part 141 of the semiconductor layer 100 and the scan connecting pattern 460 overlap with each other. The scan overlapping area OA may be disposed between the pair of adjacent split patterns 210, but is not limited thereto. The shield pattern 330 may be disposed at least in part in the scan overlapping area OA. The shield pattern 330 may overlap with the protruding part 141 of the semiconductor layer 100 and the scan connecting pattern 460, in the scan overlapping area OA. The shield pattern 330 may be disposed between the protruding part 141 of the semiconductor layer 100 and the scan connecting pattern 460, in the thickness direction (e.g., the third direction DR3), in the scan overlapping area OA. The shield pattern 330 may be disposed over an entirety of the scan overlapping area OA, but is not limited thereto.

As the shield pattern 330 is disposed between the protruding part 141 of the semiconductor layer 100 and the scan connecting pattern 460, the influence of a scan signal applied to the scan connecting pattern 460 at a position corresponding to the protruding part 141 of the semiconductor layer 100 can be reduced. In other words, even if the protruding part 141 of the semiconductor layer 100 overlaps with the scan connecting pattern 460 and a scan signal is applied to the scan connecting pattern 460, electrical influence by the scan signal to the protruding part 141 of the semiconductor layer 100 can be suppressed or prevented since the first power supply voltage ELVDD, e.g., a constant voltage, is applied to the shield pattern 330. That is, the shield pattern 330 transmits a constant voltage.

Specifically, as the shield pattern 330 (e.g., electrical shield pattern), to which a constant voltage is applied, is disposed between the protruding part 141 of the semiconductor layer 100 and the scan connecting pattern 460, electrical coupling between the semiconductor layer 100 and the scan connecting pattern 460, to which a scan signal is applied, can be suppressed or prevented. Also, the formation of a parasitic capacitor between the semiconductor layer 100 and the scan connecting pattern 460 can be suppressed or prevented. Thus, a resistive-capacitive ("RC") delay in a scan signal can be suppressed or prevented, and the threshold voltage of the first transistor T1 can be properly compensated for by the third transistor T3. Also, even if the display device 1 is driven at high speed, defects such as smudges can be suppressed or prevented. Also, the display quality of the display device 1 can be improved.

The scan connecting pattern 460 may be formed of a low-resistance material having a lower resistance than the material of the split patterns 210, in which case, an RC delay in a scan signal can be further suppressed or prevented.

Figure 11:
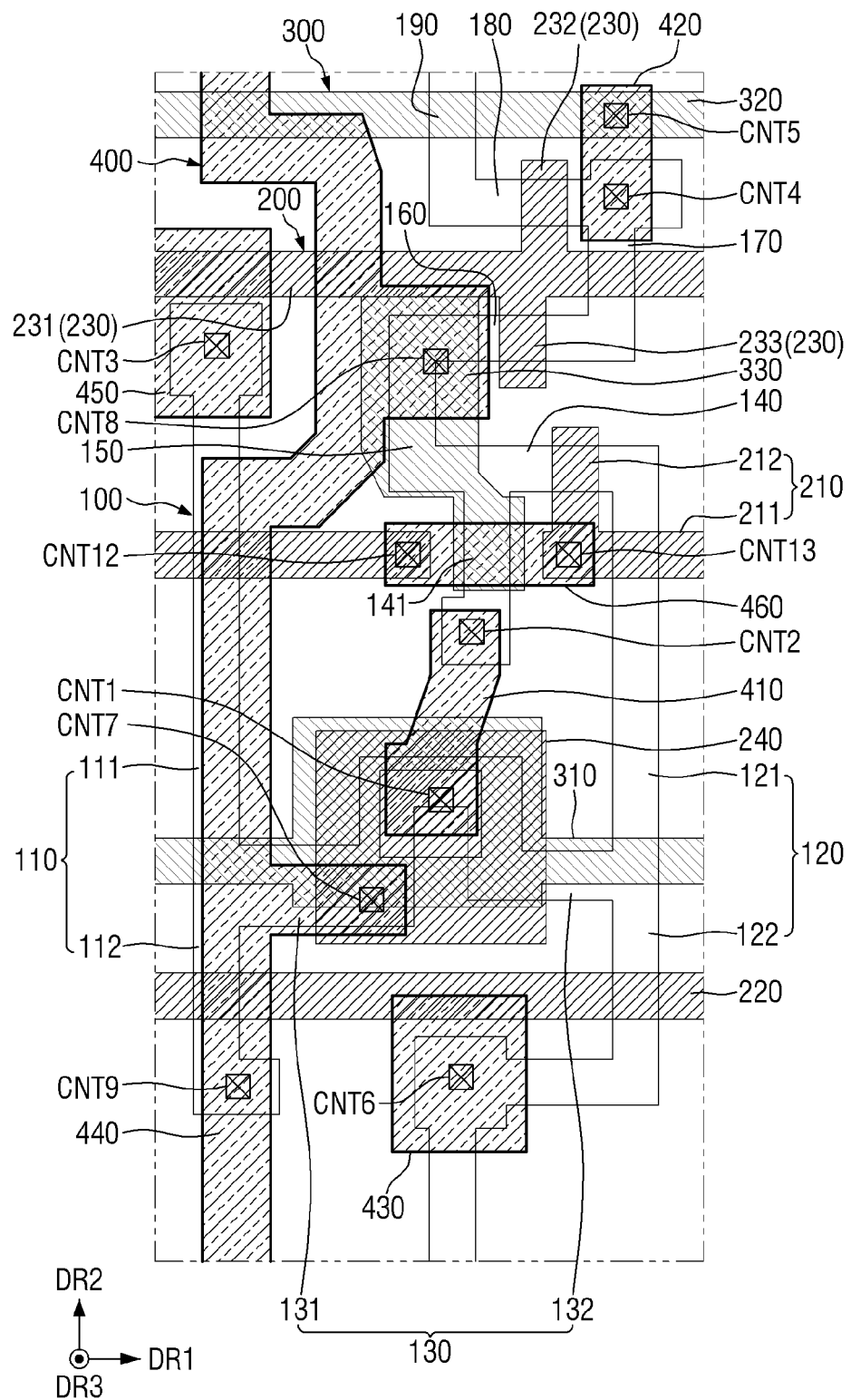
FIG. 11 is a plan view illustrating an embodiment of the semiconductor layer, the first conductive layer, the second conductive layer, and a third conductive layer of the pixel of FIG. 4.

FIG. 11 is a plan view illustrating an embodiment of the semiconductor layer 100, the first conductive layer 200, the second conductive layer 300, and the third conductive layer 400 of the pixel PX of FIG. 4.

Referring to FIGS. 4 and 11, a data pattern provided in plural including a plurality of data patterns (e.g., the first and second data patterns 410 and 420) may be provided. The first and second data patterns 410 and 420 may generally extend along the second direction DR2, and the length, in the second direction DR2, of the first and second data patterns 410 and 420 may be smaller than the length, in the second direction DR2, of the pixel PX. The first and second data patterns 410 and 420 may be physically spaced apart from each other. Each of the first and second data patterns 410 and 420 may electrically connect two elements to each other that are disconnected and/or spaced apart from each other.

The first data pattern 410 may overlap with the gate electrode pattern 240 of the first transistor T1. The first data pattern 410 may be electrically connected to the gate electrode pattern 240 of the first transistor T1 through a first contact hole CNT1, which exposes the gate electrode pattern 240 of the first transistor T1 to outside the second and third insulating layers 720 and 730 in the overlapping area of the first data pattern 410 and the gate electrode pattern 240. The first contact hole CNT1 may be located in the opening of the capacitor electrode line 310. Part of the first data pattern 410 in the first contact hole CNT1 may be insulated from the capacitor electrode line 310 by the third insulating layer 730.

The first data pattern 410 may extend upwardly from the overlapping area of the first data pattern 410 and the gate electrode pattern 240 of the first transistor T1 to overlap with the protruding part 141 of the semiconductor layer 100. The first data pattern 410 may be electrically connected to the protruding part 141 of the semiconductor layer 100 through a second contact hole CNT2, which exposes the protruding part 141 of the semiconductor layer 100 to outside the first, second, and third insulating layers 710, 720, and 730 in the overlapping area of the first data pattern 410 and the gate electrode pattern 240 of the first transistor T1. In other words, the first data pattern 410 may electrically connect the gate electrode pattern 240 of the first transistor Ti and the protruding part 141 of the semiconductor layer 100 to each other.

Due to the protruding part 141 of the semiconductor layer 100, which is disposed at least in part on a second side, in the second direction DR2, of the first scan line SL, the first data pattern 410 may neither overlap with, nor intersect, the first scan line SL. The first data pattern 410 may not be influenced by a scan voltage applied to the first scan line SL, and the threshold voltage of the first transistor T1 can be properly compensated for by the third transistor T3.

The second data pattern 420 may overlap with at least one of the fourth vertical part 170 and the fourth horizontal part 180 of the semiconductor layer 100. The second data pattern 420 may be electrically connected to at least one of the fourth vertical part 170 and the fourth horizontal part 180 of the semiconductor layer 100 through a fourth contact hole CNT4, which exposes a third connecting part 183 of the semiconductor layer 100 to outside the first, second, and third insulating layers 710, 720, and 730 in the overlapping area of the second data pattern 420 and the fourth vertical part 170/the fourth horizontal part 180.

The second data pattern 420 may extend upwardly from the overlapping area of the second data pattern 420 and the fourth vertical part 170/the fourth horizontal part 180 to overlap with the initialization voltage line 320. The second data pattern 420 may be electrically connected to the initialization voltage line 320 through a fifth contact hole CNT5, which exposes the initialization voltage line 320 to outside the third insulating layer 730 in the overlapping area of the second data pattern 420 and the fourth vertical part 170/the fourth horizontal part 180. In other words, the second data pattern 420 may electrically connect the third connecting part 183 of the semiconductor layer 100 and the initialization voltage line 320 to each other.

As the second data pattern 420 is in contact with part of the semiconductor layer 100 on a first side, in the second direction DR2, of the second scan line 230, the second data pattern 420 may neither overlap with, nor intersect, the second scan line 230. Accordingly, the electrical coupling between the second scan line 230 and the second data pattern 420 can be suppressed or prevented, and the formation of a parasitic capacitor between the second scan line 230 and the second data pattern 420 can be suppressed or prevented. Thus, an RC delay in a scan signal can be suppressed or prevented.

The first anode connecting electrode 430 may generally extend in the second direction DR2, and the length, in the second direction DR2, of the first anode connecting electrode 430 may be smaller than the length, in the second direction DR2, of the pixel PX. The first anode connecting electrode 430 may be physically spaced apart from the first and second data patterns 410 and 420. The first and second anode connecting electrodes 430 and 520 may connect the semiconductor layer 100 and the anode ANO to each other.

The first anode connecting electrode 430 may overlap with the lower portion 122 of the second vertical part 120 of the semiconductor layer 100. The first anode connecting electrode 430 may be electrically connected to the lower portion 122 of the second vertical part 120 of the semiconductor layer 100 through a sixth contact hole CNT6, which exposes the lower portion 122 of the second vertical part 120 of the semiconductor layer 100 to outside the first, second, and third insulating layers 710, 720, and 730.

The first power supply voltage line 440 may extend along the second direction DR2. The first power supply voltage line 440 may extend along the second direction DR2 into the neighboring pixels PX, beyond the boundaries of the pixel PX. The first power supply voltage line 440 may be adjacent to the left side of the pixel PX, but is not limited thereto. The first power supply voltage line 440 may be electrically connected to the capacitor electrode line 310 through a seventh contact hole CNT7, which exposes the capacitor electrode line 310 to outside the third insulating layer 730. The first power supply voltage line 440 may be electrically connected to the shield pattern 330 through am eighth contact hole CNT8, which exposes the shield pattern 330 to outside the third insulating layer 730.

Also, the first power supply voltage line 440 may be electrically connected to the lower portion 112 of the first vertical part 110 of the semiconductor layer 100 through a ninth contact hole CNT9, which exposes the lower portion 112 of the first vertical part 110 of the semiconductor layer 100 to outside the first, second, and third insulating layers 710, 720, and 730.

The data connecting pattern 450 may generally extend in the second direction DR2, and the length, in the second direction DR2, of the data connecting pattern 450 may be smaller than the length, in the second direction DR2, of the pixel PX. The data connecting pattern 450 may be physically spaced apart from the first and second data patterns 410 and 420. The data connecting pattern 450 may connect the semiconductor layer 100 and the data line 510 to each other.

The data connecting pattern 450 may overlap with the upper portion 111 of the first vertical part 110 of the semiconductor layer 100. The data connecting pattern 450 may be electrically connected to the upper portion 111 of the first vertical part 110 of the semiconductor layer 100 through a third contact hole CNT3, which exposes the upper portion 111 of the first vertical part 110 of the semiconductor layer 100 to outside the first, second, and third insulating layers 710, 720, and 730.

The scan connecting pattern 460 may overlap with the pair of adjacent split patterns 210 of the first scan line SL. In other words, a first end of the scan connecting pattern 460 may overlap with one of the split patterns 210, and the scan connecting pattern 460 may extend from the overlapping area of the scan connecting pattern 460 and one of the split patterns 210 into the other of the split patterns 210 so that a second end of the scan connecting pattern 460 may overlap with the other of the split patterns 210.

The first end of the scan connecting pattern 460 may be electrically connected to one of the split patterns 210 through a twelfth through hole CNT12, which exposes the corresponding split pattern 210 to outside the second and third insulating layers 720 and 730. Also, the second end of the scan connecting pattern 460 may be electrically connected to the other split pattern 210 through a thirteenth through hole CNT13, which exposes the corresponding split pattern 210 to outside the second and third insulating layers 720 and 730. That is, the pair of adjacent split patterns 210 may be electrically connected to each other by the scan connecting pattern 460.

The scan connecting pattern 460 may form the first scan line SL together with the split patterns 210. In other words, the first scan line SL may include a plurality of split patterns 210 and a plurality of scan connecting patterns 460. The first scan line SL may be formed or defined by the plurality of split patterns 210 and the plurality of scan connecting patterns 460. Thus, the first scan signal GW of FIG. 3 may be applied to a plurality of pixels PX arranged along the first direction DR1, via the plurality of split patterns 210 and the plurality of scan connecting patterns 460.

Figure 12:
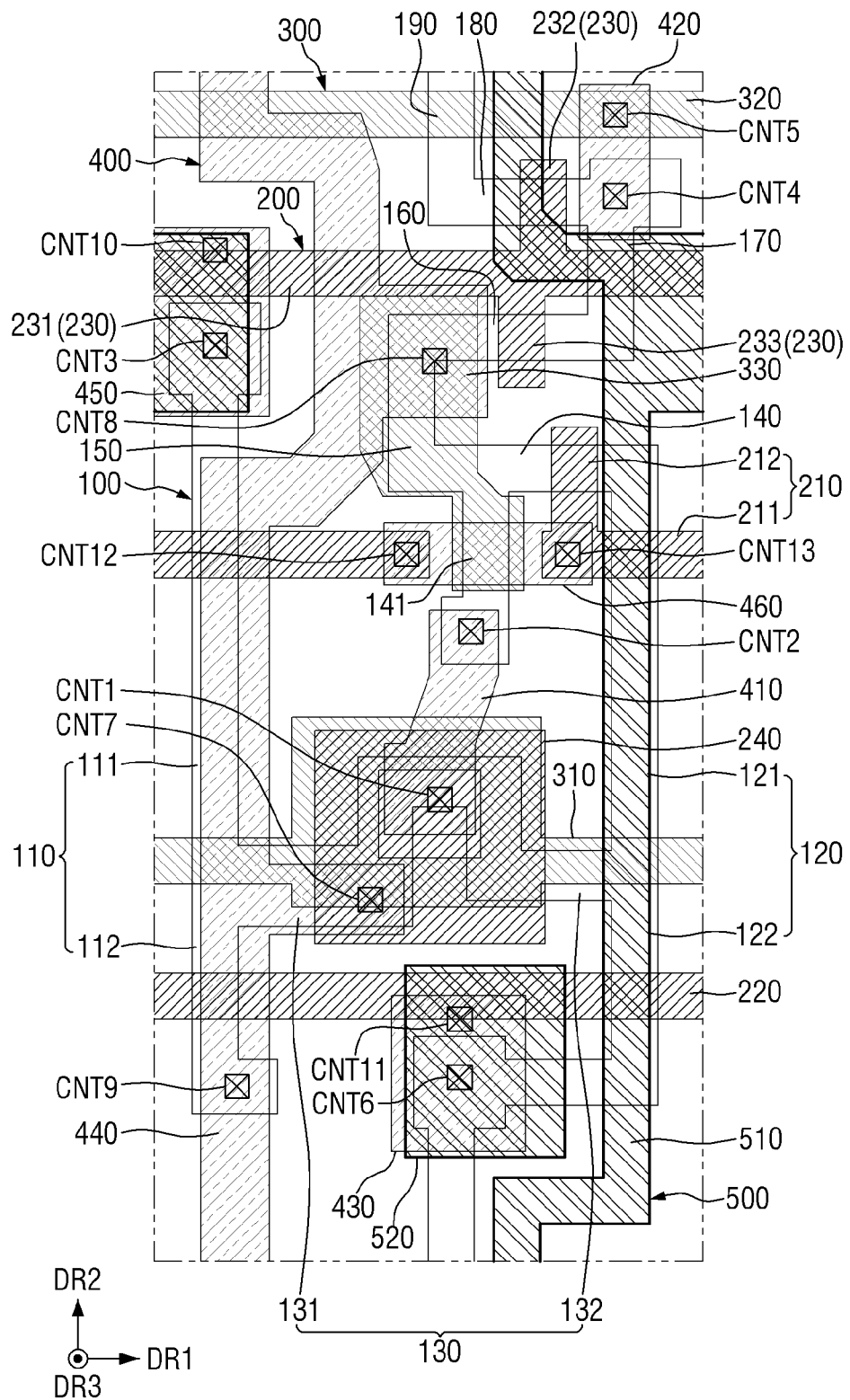
FIG. 12 is a plan view illustrating an embodiment of the semiconductor layer, the first conductive layer, the second conductive layer, the third conductive layer, and a fourth conductive layer of the pixel of FIG. 4.

FIG. 12 is a plan view illustrating the semiconductor layer 100, the first conductive layer 200, the second conductive layer 300, the third conductive layer 400, and the fourth conductive layer 500 of the pixel PX of FIG. 4.

Referring to FIG. 12, the data line 510 may extend along the second direction DR2. The data line 510 may extend along the second direction DR2 into neighboring pixels PX, beyond the boundaries of the pixel PX. The data line 510 may be disposed adjacent to the first side, in the first direction DR1, of the pixel PX. The data line 510, which extends along the second direction DR2, may include a protruding portion projected toward the first side, in the first direction DR1, of the pixel PX. The protruding portion of the data line 510 may protrude beyond the boundaries of the pixel PX, but is not limited thereto.

The data line 510 may overlap with the data connecting pattern 450. The data line 510 may be in contact with the data connecting pattern 450 through a tenth contact hole CNT10, which exposes the data connecting pattern 450 to outside the first via layer VIA1 and the passivation layer 740 in the overlapping area of the data line 510 and the data connecting pattern 450.

The second anode connecting electrode 520 may overlap with the first anode connecting electrode 430. The second anode connecting electrode 520 may be in contact with the first anode connecting electrode 430 through a second anode contact hole CNT11 (e.g., eleventh contact hole), which exposes the data connecting pattern 450 to outside the first via layer VIA1 and the passivation layer 740 in the overlapping area of the first and second anode connecting electrodes 430 and 520.

In concluding the detailed description, those skilled in the art will appreciate that many variations and modifications can be made to the embodiments without substantially departing from the invention. Therefore, the disclosed embodiments of the invention are used in a generic and descriptive sense only and not for purposes of limitation.

What is claimed is:

1. A display device comprising:
a substrate including a plurality of pixels; and
within a same pixel among the plurality of pixels, in order from the substrate:
a semiconductor layer including a channel area of a first transistor and a semiconductor area adjacent to the channel area;
a first insulating layer;
a first conductive layer including a plurality of split patterns of a first scan line which are spaced apart from each other along the first scan line, the plurality of split patterns including a split pattern which faces the channel area of the first transistor;
a second insulating layer;
a second conductive layer including a shield pattern which transmits a constant voltage;
a third insulating layer; and
a third conductive layer including a scan connecting pattern of the first scan line which electrically connects the plurality of split patterns to each other and faces the semiconductor area which is adjacent to the channel area to define a scan overlapping area,
wherein the shield pattern of the second conductive layer corresponds to the scan overlapping area.

2. The display device of claim 1, further comprising within the same pixel:
a first power supply voltage line;

a light-emitting element; and
a second transistor electrically connected between the first power supply voltage line and the light-emitting element,
wherein the second transistor includes:
a gate electrode,
a first electrode electrically connected to the first power supply voltage line, and
a second electrode electrically connected to the light-emitting element,
wherein the first transistor is electrically connected between the second electrode of the second transistor and the gate electrode of the second transistor.

3. The display device of claim 2, further comprising within the same pixel:
a data line; and
a third transistor electrically connected between the data line and the first transistor.

4. The display device of claim 3, further comprising within the same pixel:
an initialization voltage line; and
a fourth transistor electrically connected between the initialization voltage line and the first transistor.

5. The display device of claim 4, further comprising within the same pixel:
a second scan line including a gate electrode of the fourth transistor as a portion of the first conductive layer,
the initialization voltage line as a portion of the second conductive layer, and
a data pattern as a portion of the third conductive layer, wherein
the initialization voltage line and the fourth transistor are electrically connected to each other by the data pattern, and
the data pattern is spaced apart from the second scan line in a direction along the substrate.

6. The display device of claim 1, wherein within the same pixel, the plurality of split patterns and the scan connecting pattern together define the first scan line and transmit a scan signal.

7. The display device of claim 1, further comprising within the same pixel:
a first power supply voltage line;
a light-emitting element;
a second transistor electrically connected between the first power supply voltage line and the light-emitting element; and
a data pattern as a portion of the third conductive layer wherein
the data pattern electrically connects the semiconductor layer and the second transistor to each other, and
the data pattern is spaced apart from the scan connecting pattern in a direction along the substrate.

8. The display device of claim 7, wherein within the same pixel:
the plurality of split patterns and the scan connecting pattern are arranged along a first direction, and
the semiconductor layer extends across the scan connecting pattern in a second direction intersecting the first direction.

9. The display device of claim 1, wherein in a direction along the first scan line, the scan overlapping area is between the plurality of split patterns which are spaced apart from each other along the first scan line.

10. The display device of claim 9, wherein in the direction along the first scan line, the shield pattern is spaced apart from each of the plurality of split patterns.

11. The display device of claim 1, wherein the constant voltage which is transmitted by the shield pattern is a first power supply voltage.

12. The display device of claim 11, wherein within the same pixel:
the third conductive layer further includes a first power supply voltage line, and
the first power supply voltage line is electrically connected to the shield pattern of the second conductive layer through a contact hole.

13. The display device of claim 1, wherein the shield pattern is over an entirety of the scan overlapping area.

14. A display device comprising:
a plurality of pixels; and
within a same pixel among the plurality of pixels:
a first power supply voltage line;
a light-emitting element;
a first transistor electrically connected between the first power supply voltage line and the light-emitting element, the first transistor including a gate electrode and a first electrode;
a second transistor electrically connected between the gate electrode and the first electrode of the first transistor, the second transistor including a gate electrode and a channel area;
a scan line including:
a plurality of split patterns which are spaced apart from each other along the scan line and include the gate electrode of the second transistor, and
a scan connecting pattern which electrically connects the plurality of split patterns to each other; and
a shield pattern electrically connected to the first power supply voltage line, the shield pattern facing the scan connecting pattern along a thickness direction,
wherein
the plurality of split patterns are portions of a first conductive layer, and
the scan connecting pattern is a portion of a second conductive layer, which is different from the first conductive layer along the thickness direction.

15. The display device of claim 14, further comprising within the same pixel a semiconductor layer including the channel area of the second transistor,
wherein
the semiconductor layer faces the scan connecting pattern to define a scan overlapping area, and
at the scan overlapping area, the shield pattern is between the semiconductor layer and the scan connecting pattern along the thickness direction.

16. The display device of claim 15, wherein within the same pixel:
the plurality of split patterns and the scan connecting pattern are arranged along a first direction, and
the semiconductor layer extends across the scan connecting pattern in a second direction intersecting the first direction.

17. The display device of claim 16, wherein the shield pattern is over an entirety of the scan overlapping area.

18. The display device of claim 15, wherein within the same pixel:
the second conductive layer further includes a data pattern which electrically connects the semiconductor layer and the gate electrode of the first transistor to each other, and
the data pattern is spaced apart from the scan connecting pattern.

19. The display device of claim 14, wherein the shield pattern is a portion of a third conductive layer which is different from the first conductive layer and the second conductive layer along the thickness direction.

\* \* \* \* \*